United States Patent
Ito et al.

(10) Patent No.: US 9,740,636 B2
(45) Date of Patent: *Aug. 22, 2017

(54) INFORMATION PROCESSING APPARATUS

(71) Applicant: Renesas Electronics Corporation, Koutou-ku, Tokyo (JP)

(72) Inventors: Masayuki Ito, Tokyo (JP); Hideki Sugimoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/064,066

(22) Filed: Mar. 8, 2016

(65) Prior Publication Data
US 2016/0188493 A1 Jun. 30, 2016

Related U.S. Application Data

(63) Continuation of application No. 14/052,138, filed on Oct. 11, 2013, now Pat. No. 9,318,167.

(30) Foreign Application Priority Data

Oct. 17, 2012 (JP) ................................. 2012-229907

(51) Int. Cl.
G06F 13/12 (2006.01)
G06F 13/38 (2006.01)
G06F 12/14 (2006.01)
G11C 7/10 (2006.01)
(Continued)

(52) U.S. Cl.
CPC .......... *G06F 12/14* (2013.01); *G06F 9/45558* (2013.01); *G06F 13/1663* (2013.01); *G06F 13/1694* (2013.01); *G06F 13/385* (2013.01); *G11C 7/1036* (2013.01); *G06F 2009/45583* (2013.01); *G06F 2212/1052* (2013.01); *Y02B 60/1228* (2013.01); *Y02B 60/1235* (2013.01)

(58) Field of Classification Search
CPC ............................ G06F 13/385; G11C 7/1036
USPC ........................................................... 710/62
See application file for complete search history.

(56) References Cited

U.S. PATENT DOCUMENTS 7,734,903 B2 6/2010 Kim et al.
2008/0086729 A1 4/2008 Kondoh et al.
(Continued)

FOREIGN PATENT DOCUMENTS

CN 101162443 A 4/2008
JP 2008-097173 A 4/2008
JP 2008-217623 A 9/2008
(Continued)

OTHER PUBLICATIONS

Machine translation of JP 2009-251967 A, published on Oct. 29, 2009.

*Primary Examiner* — Chun-Kuan Lee
(74) *Attorney, Agent, or Firm* — Foley & Lardner LLP

(57) ABSTRACT

According to an embodiment, an information processing apparatus includes a plurality of cores, a shared resource that can be shared by the plurality of cores, and local registers that store configuration information peculiar to the respective cores. The shared resource is provided independently from the plurality of cores. The local registers are provided to the respective cores. This makes it possible to provide an information processing apparatus that can suppress increase in hardware resources even when the number of cores composing a multi-core system increases.

10 Claims, 12 Drawing Sheets

(51) Int. Cl.
*G06F 9/455* (2006.01)
*G06F 13/16* (2006.01)

(56) References Cited

U.S. PATENT DOCUMENTS

2008/0222336 A1 9/2008 Kiyoshige et al.
2010/0005323 A1 1/2010 Kuroda et al.

FOREIGN PATENT DOCUMENTS

| JP | 2009-251967 A | 10/2009 |
| WO | WO 2007/141849 A1 | 12/2007 | imation processing apparatus that is capable of suppressing increase in hardware resources even when the number of cores composing a multi-core system increases.

INFORMATION PROCESSING APPARATUS

CROSS-REFERENCE TO RELATED APPLICATIONS

This application is a continuation of U.S. application Ser. No. 14/052,138, filed on Oct. 11, 2013, which claims benefit of priority from the prior Japanese Application No. 2012-229907, filed on Oct. 17, 2012; the entire contents of all of which are incorporated herein by reference.

BACKGROUND

The present invention relates to an information processing apparatus, and for example, relates to an information processing apparatus including a plurality of cores.

A multi-core system is known that includes a plurality of cores in a single information processing apparatus to improve processing capability of the whole information processing apparatus. For example, in a multi-core system, one program is divided into a plurality of threads, and the plurality of cores respectively execute the plurality of threads to thereby improve the processing speed of the program.

Japanese Unexamined Patent Application Publication No. 2009-251967 discloses a technique for allowing dynamical change of access authority of the cores to memory protected areas while maintaining high security.

SUMMARY

In a multi-core system with a plurality of cores provided inside a single information processing apparatus, it is necessary to provide, in each of the cores, a hardware resource such as a register and a memory protection unit (MPU) for machine configuration and virtualization configuration. For this reason, the present inventor has found a problem that the more the number of cores composing a multi-core system, the more the hardware resources inside the multi-core system, thereby increasing the chip area and the cost.

Other issues and new features will be apparent from the description and attached drawings of the present invention.

An aspect of the present invention is an information processing apparatus that includes a plurality of cores, a shared resource that can be shared by the plurality of cores, and a local register that stores configuration information peculiar to each of the plurality of cores. The shared resource is provided independently from the plurality of cores, and the local register is provided to each of the plurality of cores.

According to the above aspect, it is possible to provide an information processing apparatus that is capable of suppressing increase in hardware resources even when the number of cores composing a multi-core system increases.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
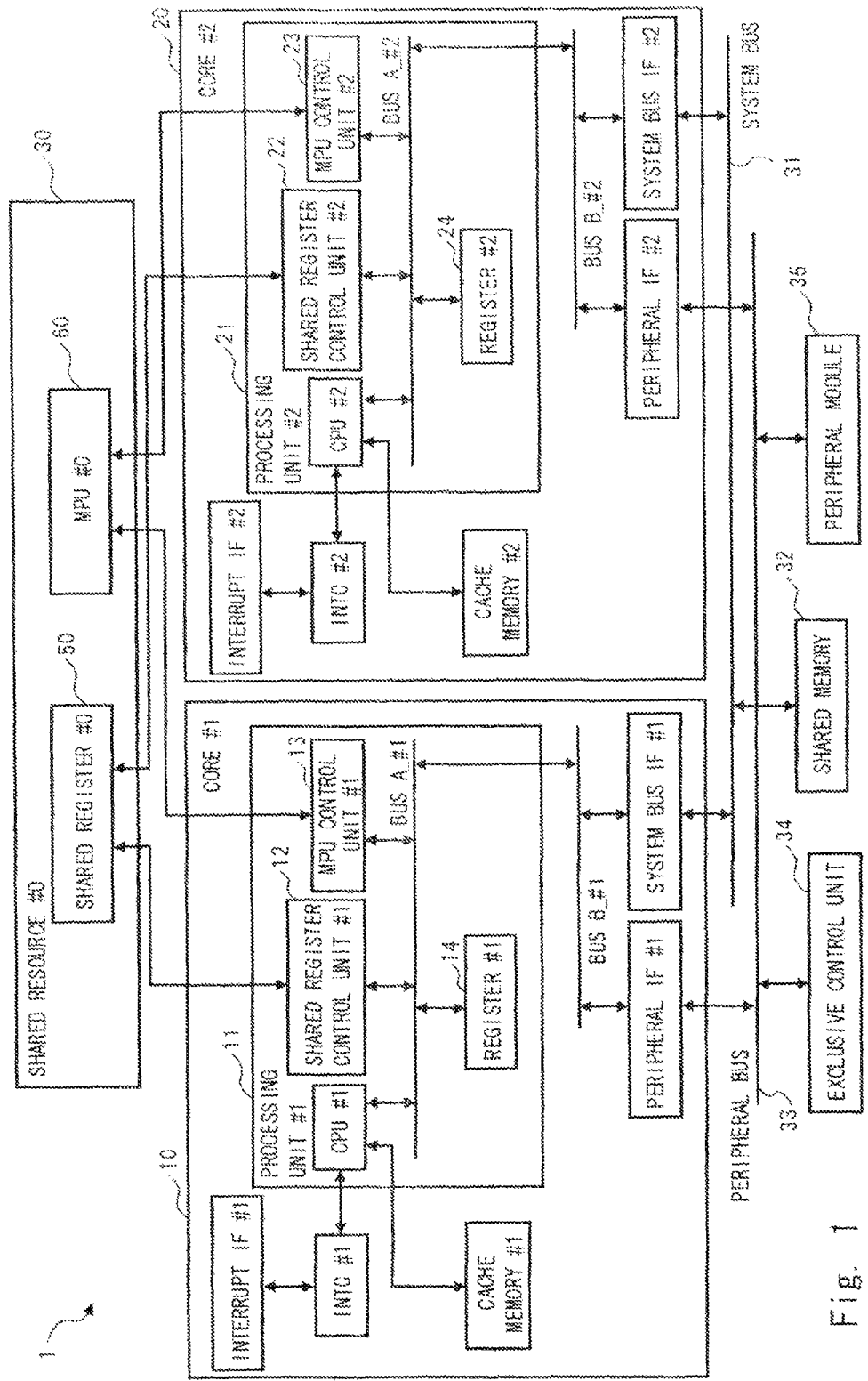
FIG. 1 is a block diagram showing an information processing apparatus according to a first embodiment.

FIG. 1 is a block diagram showing an information processing apparatus according to a first embodiment. The information processing apparatus 1 shown in FIG. 1 includes a core #1 (10), a core #2 (20), a shared resource #0 (30), a shared memory 32, an exclusive control unit 34, and a peripheral module 35.

The core #1 (10) includes a processing unit #1 (11) that performs calculation processing in the core #1 (10). The processing unit #1 (11) includes a CPU (Central Processing Unit) #1, a shared register control unit #1 (12), an MPU control unit #1 (13), and a register #1 (a local register) 14. An internal bus A_#1 is provided in the processing unit #1. The CPU #1, the shared register control unit #1 (12), the MPU control unit #1 (13), and the register #1 (14) are mutually connected via the internal bus A_#1.

Note that the configuration of the core #2 (20) is basically the same as that of the core #1 (10), thus the repeated explanation shall not be provided here. For example, the CPU #1, the shared register control unit #1 (12), the MPU control unit #1 (13) and the register #1 (14) in the processing unit #1 (11) of the core #1 (10) respectively correspond to a CPU #2, a processing unit #2 (21), a shared register control unit #2 (22), an MPU control unit #2 (23), and a register #2 (a local register) 24 in the processing unit #2 (21) of the core #2 (20).

The CPU #1 is a circuit for executing a predetermined program and is a calculation circuit operating as a main processor in the processing unit #1 (11).

The CPU #1 is connected to an interrupt controller INTC #1. The interrupt controller INTC #1 receives, from a peripheral circuit provided outside the information processing apparatus 1, an interrupt request via an interrupt interface (IF) #1 and outputs an interrupt signal to the CPU #1.

The CPU #1 is also connected to a cache memory #1. Data that is used highly frequently by the CPU #1 is accumulated in the cache memory #1. The operation of the core #1 (10) can be accelerated when the CPU #1 (10) accesses the cache memory #1 and reads the data.

Moreover, the internal bus A_#1 of the processing unit #1 (11) is connected to a system bus interface (IF) #1 via a bus B_#1. The system bus IF #1 is connected to a system bus 31 that is provided outside the core #1 (10). Similarly, in the core #2 (20), an internal bus A_#2 of the processing unit #2 (21) is connected to a system bus IF #2 via a bus B_#2. The system bus IF #2 is connected to the system bus 31 that is provided outside the core #2 (20). The shared memory 32, for example, is connected to the system bus 31. The core #1 (10) and the core #2 (20) share the shared memory 32.

The CPU #1 can read data from the shared memory 32 and write data to the shared memory 32 via the internal bus A_#1, the bus B_#1, the system bus IF #1, and the system bus 31. Similarly, the CPU #2 can read data from the shared memory 32 and write data to the shared memory 32 via the internal bus A_#2, the bus B_#2, the system bus IF #2, and the system bus 31.

The internal bus A_#1 of the processing unit #1 (11) is also connected to a peripheral interface (IF) #1 via the bus B_#1. The peripheral IF #1 is connected to a peripheral bus 33 provided outside the core #1 (10). Similarly, in the core #2 (20), the internal bus A_#2 of the processing unit #2 (21) is connected to a peripheral IF #2 via the bus B_#2. The peripheral IF #2 is connected to the peripheral bus 33 provided outside the core #2 (20). The exclusive control unit 34 and the peripheral module 35, for example, are connected to the peripheral bus 33.

Here, the exclusive control unit 34 is a circuit for restricting, when one of the core #1 (10) and the core #2 (20) is accessing the shared resource #0 or the shared memory 32, the other core from accessing the shared resource #0 or the shared memory 32. For example, when the core #1 (10) is accessing the shared resource #0, the exclusive control unit 34 prohibits the core #2 (20) from accessing the shared resource #0.

The shared resource #0 (30) is a resource that can be shared by the core #1 (10) and the core #2 (20) and includes, for example, a shared register #0 (50) and a memory protection unit MPU #0 (60). Here, the shared resource #0 (30) is provided independently from the core #1 (10) and the core #2 (20).

Figure 2:
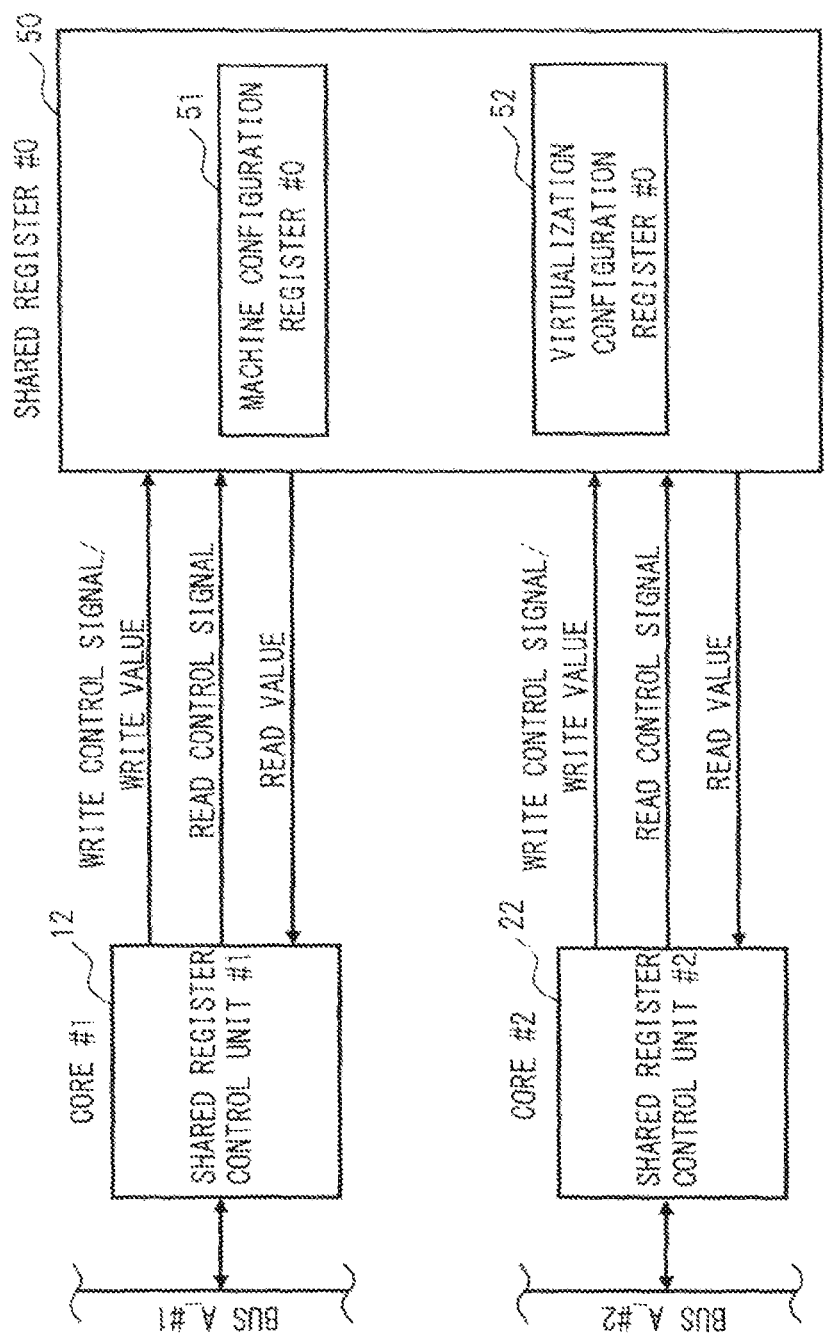
FIG. 2 is a block diagram showing shared register control units #1 and #2 and a shared register #0 that are included in the information processing apparatus according to the first embodiment.

The shared register #0 (50) is a register for storing configuration information that can be shared by the core #1 (10) and the core #2 (20) and includes, for example as shown in FIG. 2, a machine configuration register #0 (51) and a virtualization configuration register #0 (52). The machine configuration register #0 (51) stores architecture information that is followed by the whole machine including the core #1 (10) and the core #2 (20). The architecture information is information relating to a machine ID, compatibility mode setting, exception occurrence setting, etc. The virtualization configuration register #0 (52) stores configuration information in the case of using the machine including the core #1 (10) and the core #2 (20) as a virtual machine. The configuration information in the case of using the machine including the core #1 (10) and the core #2 (20) as a virtual machine here is configuration information relating to a hypervisor privilege such as a hypervisor call branch target address and a hypervisor call table size.

The shared register control unit #1 (12), which controls writing and reading to and from the shared register #0 (50) by the core #1 (10), is provided in the processing unit #1 (11) of the core #1 (10). Similarly, the shared register control unit #2 (22), which controls writing and reading to and from the shared register #0 (50) by the core #2 (20), is provided in the processing unit #2 (21) of the core #2 (20).

As shown in FIG. 2, for example when the CPU #1 of the core #1 (10) writes a setting value to the shared register #0 (50), the CPU #1 outputs a write command to the shared register control unit #1 (12) via the internal bus A_#1. In response to the write command, the shared register control unit #1 (12) outputs a write control signal and a write value (a setting value) to the shared register #0 (50). When the write control signal is supplied, the shared register #0 (50) stores the write value (the setting value) to a predetermined register.

Further, for example when the CPU #1 of the core #1 (10) reads a setting value from the shared register #0 (50), the CPU #1 outputs a read command to the shared register control unit #1 (12) via the internal bus A_#1. In response to the read command, the shared register control unit #1 (12) outputs a read control signal to the shared register #0 (50). When the read control signal is supplied, the shared register #0 (50) reads a read value (a setting value) from the predetermined register and outputs the read value (the setting value) to the shared register control unit #1 (12). Then, the shared register control unit #1 (12) outputs the read value (the setting value) to the CPU #1 via the internal bus A_#1.

Note that the above-mentioned processing is performed in the core #2 (20) when the CPU #2 writes a setting value to the shared register #0 (50) or reads a setting value from the shared register #0 (50). Moreover, a configuration may be employed in which important information stored to the shared register #0 (50), for example, is written only by a core with master authority (e.g., the core #1 (10)).

The memory protection unit MPU #0 (60) shown in FIG. 1 is a circuit for protecting the shared memory 32 from invalid access by the core #1 (10) and the core #2 (20). For example, when the CPU #1 accesses the shared memory 32, the memory protection unit MPU #0 (60) evaluates whether or not the CPU #1 is allowed to access the shared memory 32 based on memory access information including a memory address output from the CPU #1. When the memory protection unit MPU #0 (60) evaluates that the access is allowed, the CPU #1 accesses the shared memory 32.

Here, the memory protection unit MPU #0 (60) can be used when the core #1 (10) and the core #2 (20) access any other shared circuits than the shared memory 32, for example when the core #1 (10) and the core #2 (20) access the peripheral module 35. Explained below is an example when the memory protection unit MPU #0 (60) protects the shared memory 32.

FIG. 1 shows an example in which the shared memory 32 is connected to the system bus 31. However, for example, a memory (e.g., an SRAM and a flash memory) connected to the CPU #1 or a memory (e.g., an SRAM and a flash memory) connected to the CPU #2 may be used as the shared memory.

The MPU control unit #1 (13), which controls access to the memory protection unit MPU #0 (60) by the core #1 (10), is provided in the processing unit #1 of the core #1 (10). Similarly, the MPU control unit #2 (23), which controls access to the memory protection unit MPU #0 (60) by the core #2 (20), is provided in the processing unit #2 of the core #2 (20). Note that the MPU control unit #1 (13), the MPU control unit #2 (23), and the memory protection unit MPU #0 (60) are explained in detail in a second embodiment.

The register #1 (14) that stores configuration information peculiar to the core #1 (10) is provided in the processing unit #1 (11) of the core #1 (10). The configuration information peculiar to the core #1 (10) is, for example, ID information of the CPU #1 and configuration information of the cache memory #1. Similarly, the register #2 (24) that stores configuration information peculiar to the core #2 (20) is provided in the operation unit #2 (21) of the core #2 (20).

In related arts, it has been necessary, in a multi-core system including a plurality of cores inside a single information processing apparatus, to provide a hardware resource such as a register and a memory protection unit for machine configuration and virtualization configuration in each of the cores. Accordingly, there has been a problem in which the more the number of cores composing a multi-core system, the more hardware resources provided inside the multi-core system, thereby increasing the chip area and the cost.

To that end, in the information processing apparatus 1 according to this embodiment, the shared resource #0 (30) that can be shared by the core #1 (10) and the core #2 (20) composing a multi-core system is provided independently from the core #1 (10) and the core #2 (20). Further, the register #1 (14) that stores the configuration information peculiar to the core #1 (10) is provided in the core #1 (10), and the register #2 (24) that stores the configuration information peculiar to the core #2 (20) is provided in the core #2 (20).

As described above, in the information processing apparatus according to this embodiment, the registers storing the configuration information peculiar to the respective cores remain inside the respective cores, and the shared resource that can be shared by both cores is provided outside the cores to allow sharing. With such a configuration, it is possible to simplify a circuit configuration of the cores and suppress increase in hardware resources even when the number of the cores composing the multi-core system increases. This therefore suppresses increase in the chip area of the information processing apparatus and increase in the cost.

Second Embodiment

Next, a second embodiment is explained. In this embodiment, detailed explanation is given for the MPU control unit #1 (13), the MPU control unit #2 (23), and the memory protection unit MPU #0 (60) that are included in the information processing apparatus explained in the first embodiment. Note that other configuration is the same as the information processing apparatus explained in the first embodiment, thus the same components are denoted by the same reference numerals, and the repeated explanation shall not be provided here.

Figure 3:
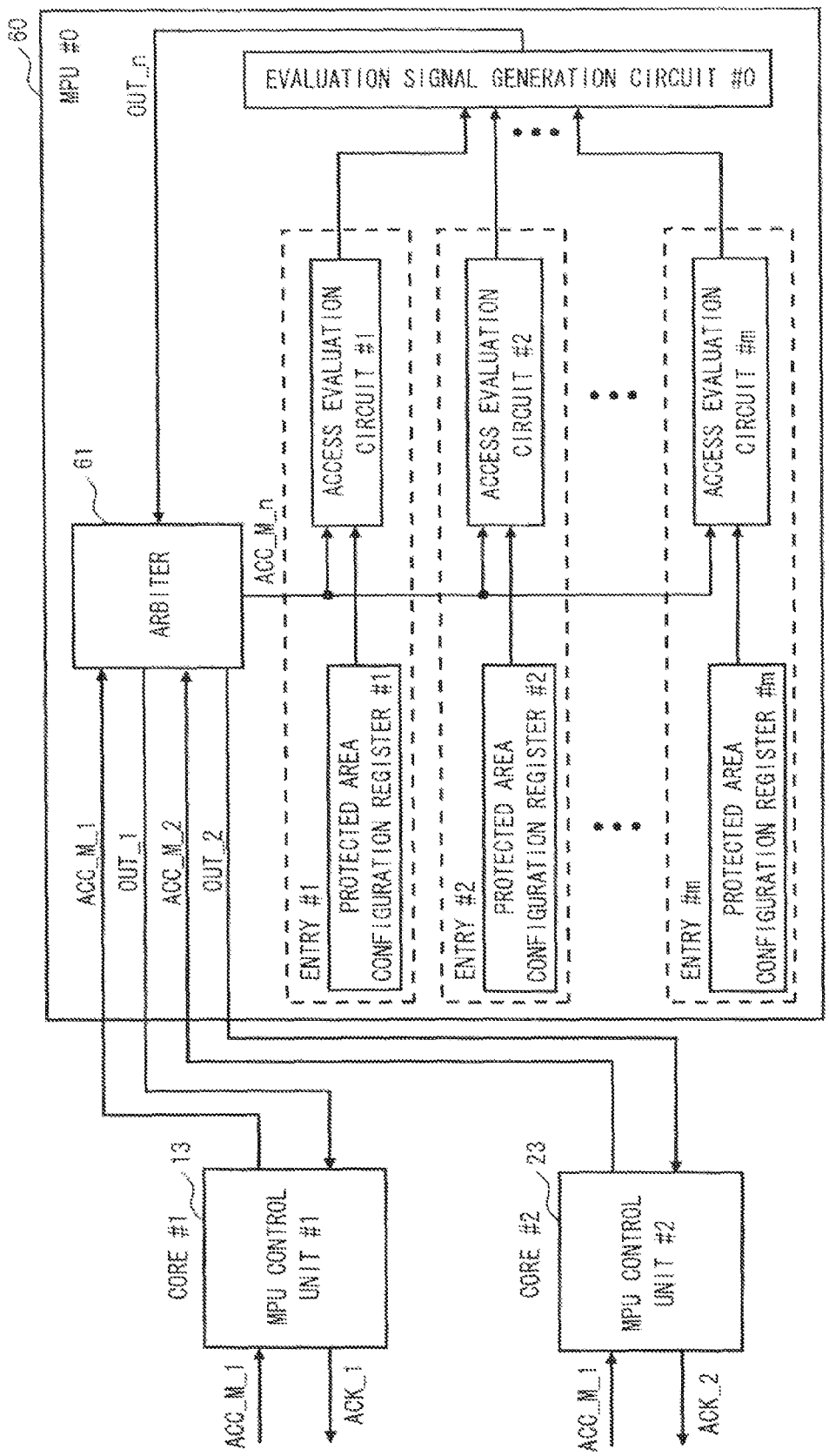
FIG. 3 is a block diagram showing MPU control units #1 and #2 and a memory protection unit MPU #0 that are included in an information processing apparatus according to a second embodiment.

FIG. 3 is a block diagram showing the MPU control unit #1 (13), the MPU control unit #2 (23), and the memory protection unit MPU #0 (60) included in the information processing apparatus according to this embodiment. The memory protection unit MPU #0 (60) includes an arbiter 61 and protected area configuration registers #1 to #m (first protected area configuration registers), access evaluation circuits #1 to #m (first access evaluation circuits), and an evaluation signal generation circuit #0. Here, m is an integer of two or greater.

The MPU control unit #1 (13) included in the core #1 (10) outputs, to the arbiter 61 of the memory protection unit MPU #0 (60), for example memory access information ACC_M_1 that is output from the CPU #1 when the CPU #1 accesses the shared memory 32. The MPU control unit #1 (13) also outputs a notification signal ACK_1 to the CPU #1.

Similarly, the MPU control unit #2 (23) included in the core #2 (20) outputs, to the arbiter 61 of the memory protection unit MPU #0 (60), for example memory access information ACC_M_2 that is output from the CPU #2 when the CPU #2 accesses the shared memory 32. The MPU control unit #2 (23) also outputs a notification signal ACK_2 to the CPU #2.

The arbiter 61 included in the memory protection unit MPU #0 (60) arbitrates evaluation of whether or not the core #1 (10) is allowed to access the shared memory 32 and evaluation of whether or not the core #2 (20) is allowed to access the shared memory 32. That is, when there is conflict between an evaluation request from the MPU control unit #1 (13) and an evaluation request from the MPU control unit #2 (23), the arbiter 61 arbitrates those evaluation requests.

Specifically, when there is conflict between the memory access information ACC_M_1 output from the MPU control unit #1 (13) and the memory access information ACC_M_2 output from the MPU control unit #2 (23), the arbiter 61 arbitrates the memory access information ACC_M_1 and ACC_M_2 and outputs one of the memory access information ACC_M_n (n=1 or 2) to the access evaluation circuits #1 to #m. Moreover, the arbiter 61 outputs an evaluation signal OUT_n to one of the MPU control units 13 and 23 corresponding to the selected memory access information ACC_M_n. That is, when the arbiter 61 selects the memory access information ACC_M_1, the arbiter 61 outputs, to the MPU control unit #1 (13), an evaluation signal OUT_1 output from the evaluation signal generation circuit #0. On the other hand, when the arbiter 61 selects the memory access information ACC_M_2, the arbiter 61 outputs, to the MPU control unit #2 (23), an evaluation signal OUT 2 output from the evaluation signal generation circuit #0.

Here, the memory access information ACC_M_n includes, for example, a memory address, information relating to a type of access to the shared memory 32 (write access or read access), and information relating to an access width (byte/halfword/full word).

The protected area configuration registers #1 to #m store protected area information relating to protected areas of the shared memory 32. That is, the protected area configuration registers #1 to #m store address information corresponding to memory areas of the shared memory 32 and authority information (attribute information) relating to authority of each core to access the memory areas of the shared memory 32.

Figure 4:
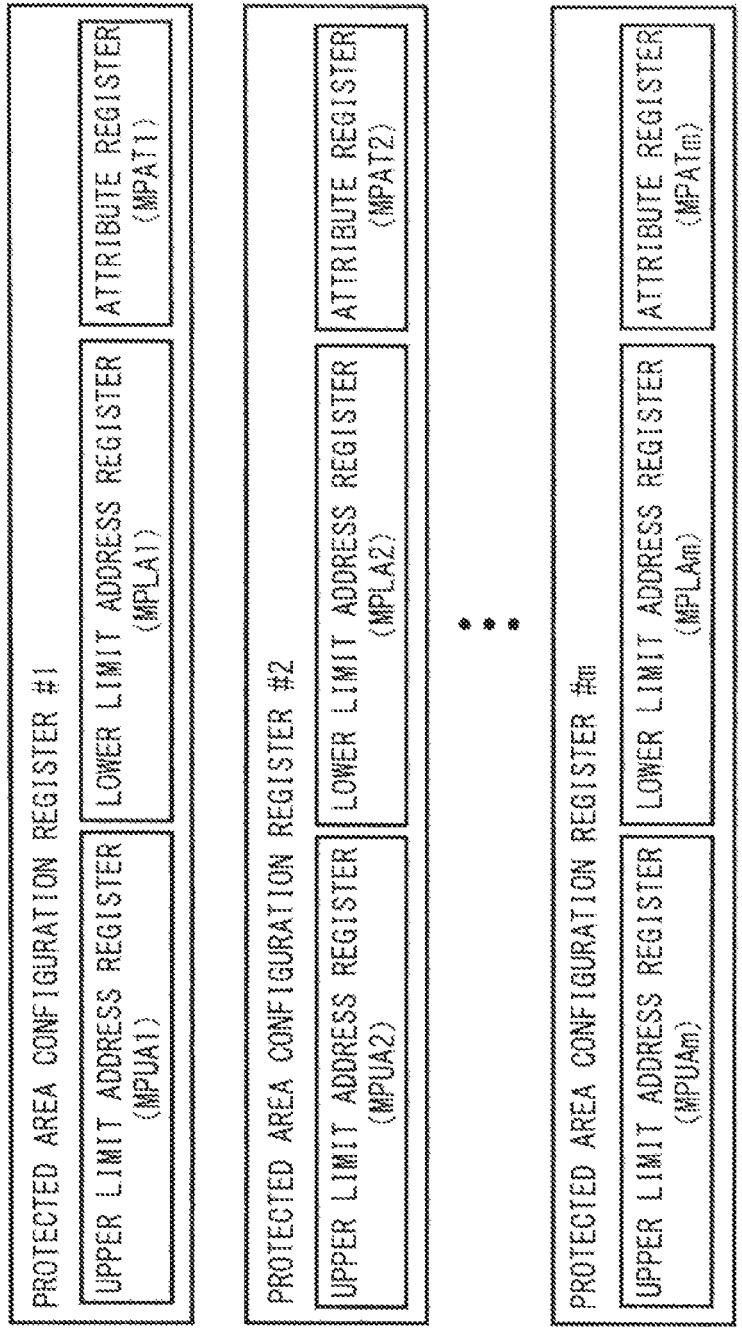
FIG. 4 is a diagram showing an example of a protected area configuration register included in the memory protection unit MPU #0.

FIG. 4 is a diagram showing an example of the protected area configuration registers #1 to #m included in the memory protection unit MPU #0 (60). As shown in FIG. 4, the protected area configuration registers #1 to #m respectively include upper limit address registers (MPUA1 to MPUAm), lower limit address registers (MPLA1 to MPLAm), and attribute registers (MPAT1 to MPATm).

The upper limit address registers (MPUA1 to MPUAm) are registers that store upper limit addresses of respective memory areas #1 to #m. The lower limit address registers (MPLA1 to MPLAm) are registers that store lower limit addresses of the respective memory areas #1 to #m. Each of the memory areas #1 to #m corresponds to memory areas of entries #1 to #m. For example, when the memory area #1 is set as the memory area of the entry #1, the upper limit address of the memory area #1 is stored to the upper limit address register MPUA1 of the protected area configuration register #1, and the lower limit address of the memory area #1 is stored to the lower limit address register MPLA1. At this time, the memory areas #1 to #m of the shared memory 32, i.e., the memory areas of the entries #1 to #m, may be configured not to overlap with each other or may be configured to overlap with each other.

Note that the memory areas #1 to #m may be specified using the lower limit addresses and the sizes of the memory areas instead of using the upper limit addresses and the lower limit addresses as above. In this case, lower limit address registers and area size registers are provided, for example.

The attribute registers (MPAT1 to MPATm) are registers that store attributes (e.g., allow/prohibit writing, allow/prohibit reading, and allow/prohibit execution) of the memory areas #1 to #m (the entries #1 to #m). The attribute registers (MPAT1 to MPATm) may also store the ID information. The ID information is core ID information corresponding to each core and group ID information that groups a plurality of cores, for example. When the core ID information is stored to the attribute register, for instance, evaluation of access to the shared memory 32 can be performed on each core.

As shown in FIG. 3, the access evaluation circuits #1 to #m are provided to correspond to the protected area configuration register #1 to #m, respectively. In other words, the protected area configuration registers #1 to #m and the access evaluation circuits #1 to #m are provided to correspond to the entries #1 to #m, respectively. The access evaluation circuits #1 to #m evaluate whether or not the core #1 (10) and the core #2 (20) are allowed to access the shared memory 32 based on the memory access information ACC_M_n, which is output from the core #1 (10) and the core #2 (20), and the protected area information, which is stored to the protected area configuration registers #1 to #m.

That is, when a memory address included in the memory access information ACC_M_n is included in the memory areas stored to the protected area configuration registers #1 to #m, and further, when the core #1 (10) and the core #2 (20) have access authority to the memory area 32, the access evaluation circuits #1 to #m evaluate that the core #1 (10) and the core #2 (20) are allowed to access the shared memory 32.

For example, when a memory address ADD_M_1 included in the memory access information ACC_M_1 output from the core #1 (10) is included in the memory area #1 stored to the protected area configuration register #1, the access evaluation circuit #1 evaluates that the memory address ADD_M_1 is included in the entry #1. That is, when the memory address ADD_M_1 is within the range between the upper limit address register (MPUA1) and the lower limit address register (MPLA1), the area evaluation circuit #1 evaluates that the memory address ADD_M_1 is included in the entry #1.

Further, when a type of access to the shared memory 32 (i.e., write, read, execute etc.) by the core #1 (10) is allowed, the access evaluation circuit #1 allows the core #1 (10) to access the shared memory 32. Here, the case in which a type of access is allowed is the case in which a type of access to the shared memory 32 by the core #1 (10) is allowed in the attribute register (MPAT1).

The evaluation signal generation circuit #0 generates an evaluation signal OUT_n based on an evaluation result output from the access evaluation circuits #1 to #m and outputs the generated evaluation signal OUT_n to the arbiter 61. That is, when any of the access evaluation circuits #1 to #m evaluates that access to the shared memory 32 is allowed, the evaluation signal generation circuit #0 outputs the evaluation signal OUT_n indicating access allowed to the shared memory 32. On the other hand, when all of the access evaluation circuits #1 to #m evaluate that access to the shared memory 32 is prohibited, the evaluation signal generation circuit #0 outputs the evaluation signal OUT_n indicating access prohibited to the shared memory 32. Note that when the memory areas of the entries #1 to #m are configured to overlap with each other, a plurality of the access evaluation circuits #1 to #m may evaluate that access is allowed.

When the evaluation signal OUT_1 output from the arbiter 61 indicates that access is allowed, the MPU control unit #1 (13) outputs an access allowed notification signal to the CPU #1 as the notification signal ACK_1. After that, the CPU #1 accesses the shared memory 32. Meanwhile, when the evaluation signal OUT_1 indicates that the access is prohibited, the MPU control unit #1 (13) outputs an exception notification signal to the CPU #1 as the notification signal ACK_1. In this case, access to the shared memory 32 by the CPU #1 is prohibited. Note that the MPU control unit #2 (23) operates in a similar manner as above.

Figure 5:
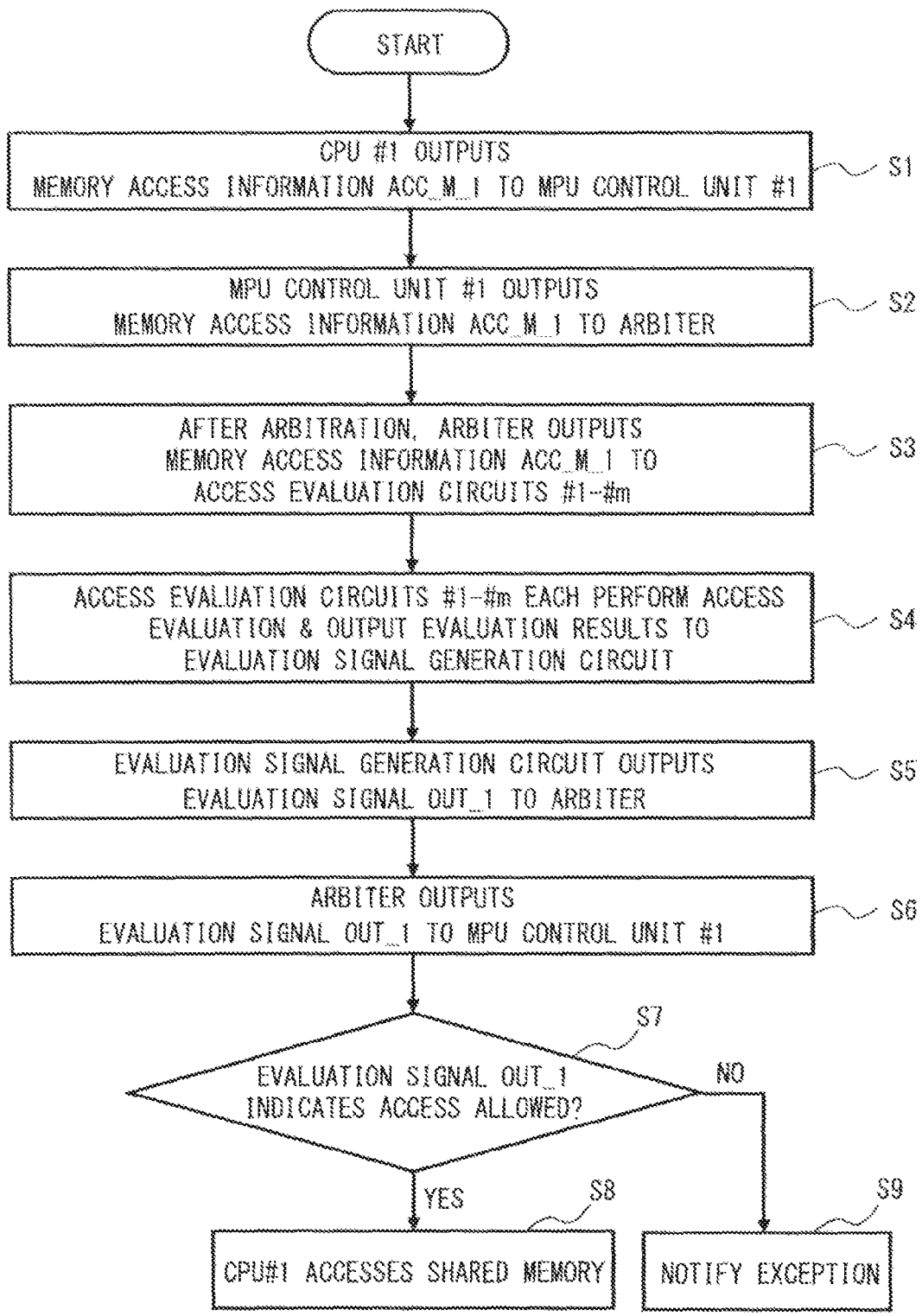
FIG. 5 is a flowchart for explaining an operation of the information processing apparatus according to the second embodiment.
Figure 6:
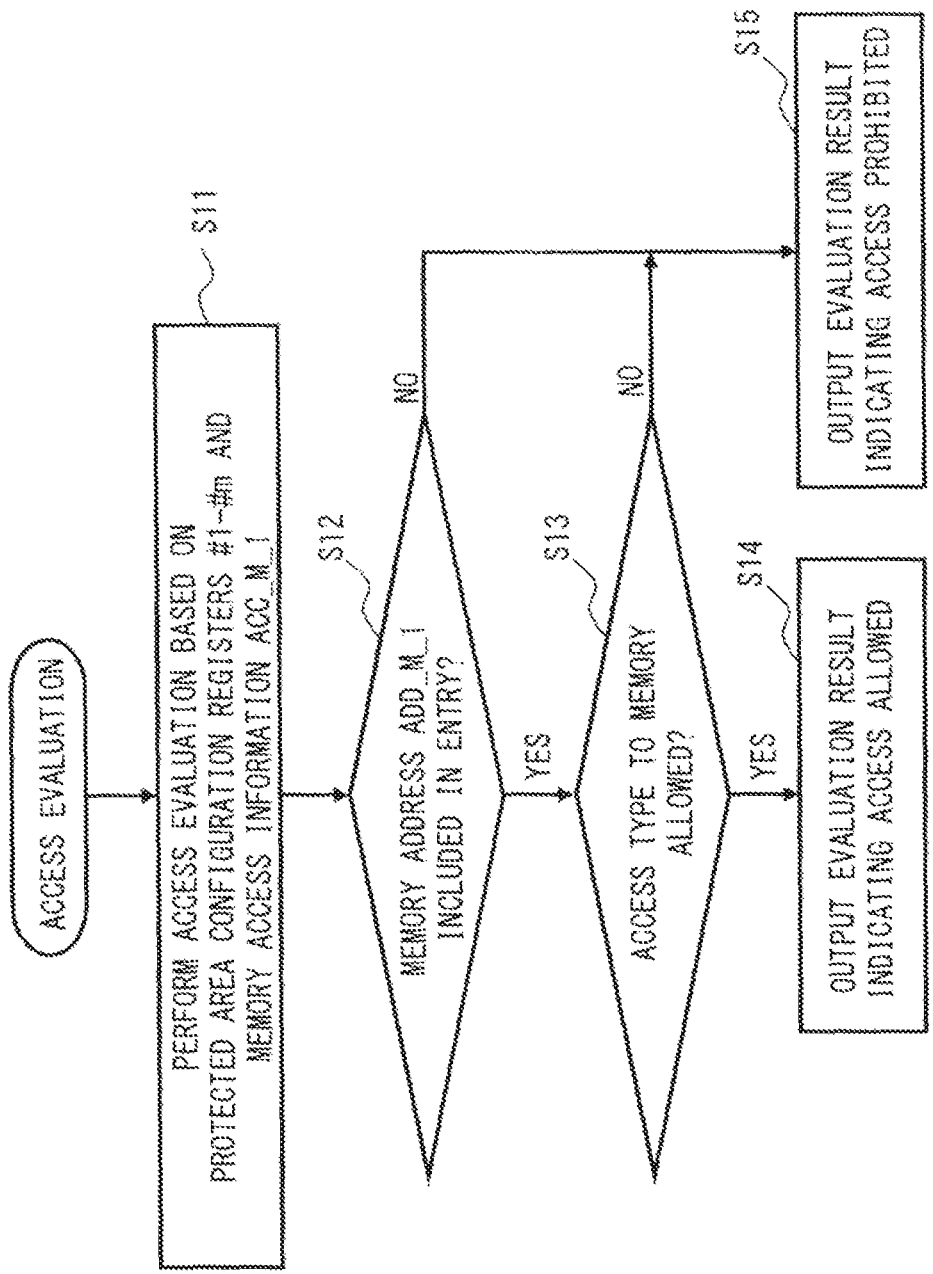
FIG. 6 is a flowchart for explaining an operation of the information processing apparatus according to the second embodiment.

Next, an operation of the information processing apparatus according to this embodiment is explained using flowcharts shown in FIGS. 5 and 6. Explained below is a case in which the CPU #1 included in the core #1 (10) accesses the shared memory 32 as an example.

When the CPU #1 accesses the shared memory 32, the CPU #1 outputs the memory access information ACC_M_1 to the MPU control unit #1 (13) (Step S1). Then, the MPU control unit #1 (13) outputs the memory access information ACC_M_1 to the arbiter 61 (Step S2). When there is conflict between evaluation of whether or not the core #1 (10) is allowed to access the shared memory 32 and evaluation of whether or not the core #2 (20) is allowed to access the shared memory 32, the arbiter 61 arbitrates these evaluation requests. After arbitration by the arbiter 61, the arbiter 61 outputs the memory access information ACC_M_1 to the access evaluation circuits #1 to #m (Step S3). After that, the access evaluation circuits #1 to #m each perform access evaluation and output evaluation results to the evaluation signal generation circuit #0 (Step S4).

Access evaluation is explained in detail using the flowchart shown in FIG. 6. In access evaluation, the access evaluation circuits #1 to #m perform access evaluation based on the protected area configuration registers #1 to #m and the memory access information ACC_M_1 (Step S11). That is, the access evaluation circuits #1 to #m evaluate whether or not the memory address ADD_M_1 included in the memory access information ACC_M_1 is included in the respective entries #1 to #m (i.e., the memory areas #1 to #m that are stored to the protected area configuration registers #1 to #m). Then, when the memory address ADD_M_1 is not included in the entries #1 to #m (Step S12: No), the access evaluation circuits #1 to #m output, to the evaluation signal generation circuit #0, evaluation results indicating that access is prohibited (Step S15).

Meanwhile, when the memory address ADD_M_1 is included in the entries #1 to #m (Step S12: Yes), and further, a type of access to the shared memory 32 by the CPU #1 is allowed (Step S13: Yes), the access evaluation circuits #1 to #m output, to the evaluation signal generation circuit #0, evaluation results indicating that the access is allowed (Step S14). Here, the case in which a type of access to the shared memory 32 by the CPU #1 is allowed is the case in which a type of access to the shared memory 32 by the CPU #1 is allowed in the attribute registers of the protected area configuration registers #1 to #m, for example.

Moreover, when the memory address ADD_M_1 is included in the entries #1 to #m (Step S12: Yes), and further, when a type of access to the shared memory 32 by the CPU #1 is not allowed (Step S13: No), the access evaluation circuits #1 to #m output, to the evaluation signal generation circuit #0, evaluation results indicating that the access is prohibited (Step S15).

Each of the access evaluation circuits #1 to #m performs access evaluation in this way. After the access evaluation, the evaluation signal generation circuit #0 outputs the evaluation signal OUT_1 to the arbiter 61 (Step S5). The arbiter 61 outputs the evaluation signal OUT_1 to the MPU control unit #1 (13) (Step S6). When the evaluation signal OUT_1 indicates that the access is allowed (Step S7: Yes), the MPU control unit #1 (13) outputs the access allowed notification signal to the CPU #1 as the notification signal ACK_1. After that, the CPU #1 accesses the shared memory 32 (Step S8). On the other hand, when the evaluation signal OUT_1 indicates that the access is prohibited (Step S8: No), the MPU control unit #1 (13) outputs the exception notification signal to the CPU #1 as the notification signal ACK_1 (Step S9). In this case, access to the shared memory 32 by the CPU #1 is prohibited.

The memory protection unit is a circuit with a large circuit area among the circuits included in each core. Especially when there are many entries (e.g., m=16), the circuit area occupying in each core increases and power consumption during the access evaluation also increases. In other words, as memory protection evaluation must be performed for every memory access, the more the number of entries, the larger the power consumption. For this reason, there has been a problem that when the number of cores composing a multi-core system increases, the circuit area and power consumption also increases accordingly. This problem is especially prominent in memory protection units.

In the information processing apparatus according to this embodiment, the core #1 (10) and the core #2 (20) share the memory protection unit MPU #0 (60). With such a configuration, it is possible to simplify a circuit configuration of the cores and suppress increase in hardware resources even when the number of the cores composing a multi-core system increases.

Specifically, as the memory protection unit is shared, the number of entries included in the memory protection unit can be made small for the whole information processing apparatus, thereby reducing power consumption of the whole information processing apparatus. For example, when there are two cores composing a multi-core system and the number of entries m of the memory protection unit is 16, if a memory protection unit is provided to each core, the number of entries for the whole information processing apparatus will be 32 (=16+16). However, when the cores share a memory protection unit, the number of entries for the whole information processing apparatus will be 16, thereby reducing the power consumption approximately by half.

As the information processing apparatus, there are, for example, a microprocessor used for a personal computer and the like and a microcontroller with specialized functions in controlling electronic devices to be mounted. The microprocessor handles a large-capacity memory. Thus, the microprocessor is often equipped with a memory management unit (MMU) that includes a memory protection function and an address conversion function as a memory protection mechanism.

Meanwhile, as the functions of the microcontroller are specialized in controlling electronic devices to be mounted, it is not necessary to mount a large-capacity memory and the address conversion function for converting a virtual address into a physical address. Moreover, the microcontroller is requested to reduce power consumption and its area. For this reason, when the memory management unit (MMU) is mounted as the memory protection mechanism of the microcontroller, overhead of hardware resources will be large.

In addition, the microcontroller is used for control of electronic devices, thus real-time property is important. However, when the memory management unit (MMU) is mounted as the memory protection mechanism of the microcontroller, table walk occurs upon a TLB miss, thereby taking time for processing and losing the real-time property.

Therefore, it is preferable to use a memory protection unit (MPU) not including the address conversion function as the memory protection mechanism of the microcontroller than to use an MMU including the address conversion function. Accordingly, the information processing apparatus according to this embodiment is especially suited for a microcontroller where reduced power, a smaller area, and real-time property is valued.

Note that the information processing apparatus according to this embodiment does not hinder application to an information processing apparatus including the memory protection unit equipped with the address conversion function and can be applied to a microprocessor equipped with the memory management unit (MMU) including the address conversion function, for example. Further, the information processing apparatus according to this embodiment can also be applied to the microprocessor not requiring the address conversion function, for example.

Third Embodiment

Figure 7:
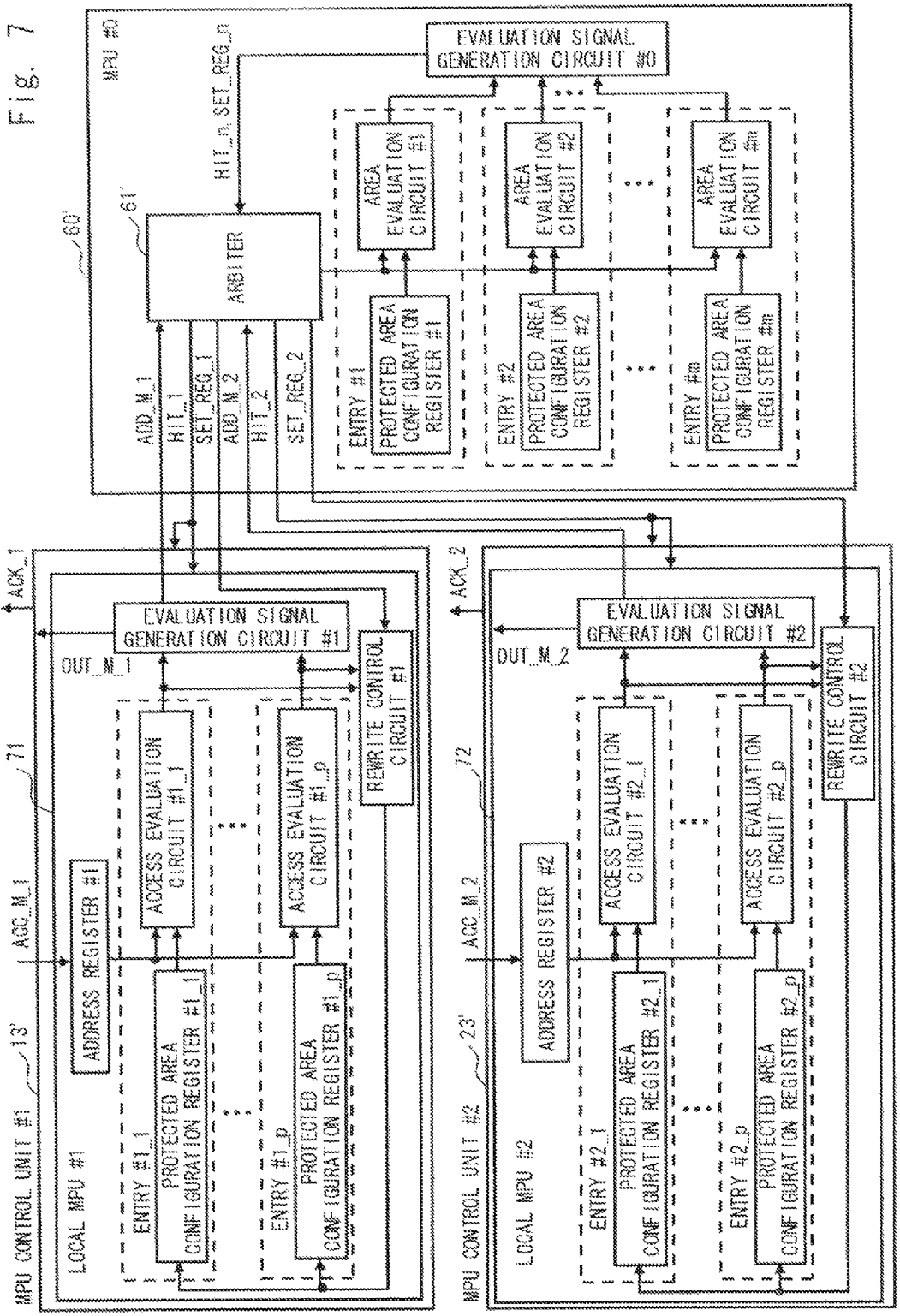
FIG. 7 is a block diagram showing MPU control units #1 and #2 and a memory protection unit MPU #0 that are included in the information processing apparatus according to a third embodiment.

Next, a third embodiment is explained. FIG. 7 is a block diagram showing an MPU control unit #1 (13'), an MPU control unit #2 (23'), and a memory protection unit MPU #0 (60') that are included in an information processing apparatus according to this embodiment. In this embodiment, as shown in FIG. 7, a difference from the information processing apparatus explained in the second embodiment is that the MPU control unit #1 (13') and the MPU control unit #1 (23') respectively include a local MPU #1 (71) and a local MPU #2 (72). Other configuration is the same as the information processing apparatus explained in the first and second embodiment.

As shown in FIG. 7, the MPU control unit #1 (13') includes the local MPU #1 (71). The local MPU #1 (71) includes an address register #1, protected area configuration registers #1_1 to #1_p (second protected area configuration registers), access evaluation circuits #1_1 to #1_p (second access evaluation circuits), an evaluation signal generation circuit #1, and a rewrite control circuit #1. Here, p is an integer of 1≤p<m. The address register #1 is a register for temporarily holding memory access information ACC_M_1 supplied to the MPU control unit #1 (13').

The protected area configuration registers #1_1 to #1_p store protected area information relating to protected areas of the shared memory 32. That is, the protected area configuration registers #1_1 to #1_p store address information corresponding to memory areas of the shared memory 32 and authority information relating to authority of the core #1 (10) to access the memory areas of the shared memory 32. Note that the protected area configuration registers #1_1 to #1_p have the same configuration as the protected area configuration registers #1 to #m (see FIG. 4) explained in the second embodiment, thus the repeated explanation shall not be provided here.

The access evaluation circuits #1_1-#1_p are provided to correspond to the protected area configuration registers #1_1 to #1_p, respectively. In other words, the protected area configuration registers #1_1 to #1_p and the access evaluation circuit #1_1 to #1_p are provided to correspond to entries #1_1 to #1_p, respectively. The access evaluation circuits #1_1 to #1_p evaluate whether or not the core #1 (10) is allowed to access the shared memory 32 based on the memory access information ACC_M_1, which is output from the address register #1 (i.e., is output from the CPU #1), and the protected area information, which is stored to the protected area configuration registers #1_1 to #1_p.

That is, when a memory address included in the memory access information ACC_M_1 is included in the memory areas stored to the protected area configuration registers #1_1 to #1_p, and further, when the core #1 (10) has access authority to the memory area 32, the access evaluation circuits #1_1 to #1_p evaluate that the core #1 (10) is allowed to access the shared memory 32.

The evaluation signal generation circuit #1 outputs an evaluation signal OUT_M_1 to the MPU control unit #1 (13') or the memory address ADD_M_1 to an arbiter 61'.

That is, when the memory address ADD_M_1 results in a hit, and further, the core #1 (10) is evaluated to have access authority to the memory area 32, the evaluation signal generation circuit #1 generates the evaluation signal OUT_M_1 indicating access allowed and outputs the generated evaluation signal OUT_M_1 to the MPU control unit #1 (13'). The case in which the memory address ADD_M_1 results in a hit is the case in which any of the access evaluation circuits #1_1 to #1_p evaluates that the memory address ADD_M_1 included in the memory access information ACC_M_1 is included in the memory areas stored to the protected area configuration register #1_1 to #1_p.

Meanwhile, when the memory address ADD_M_1 results in a hit, and further, the core #1 (10) is evaluated to have no access authority to the memory area 32, the evaluation signal generation circuit #1 generates the evaluation signal OUT_M_1 indicating access prohibited and outputs the generated evaluation signal OUT_M_1 to the MPU control unit #1 (13'). Note that when overlapping of the memory areas is allowed for the entries #1_1 to #1_p, it is necessary to perform access evaluation on other entries of the memory protection unit MPU #0 (60'). Thus, the evaluation signal generation circuit #1 will not output the evaluation signal OUT_M_1 to the MPU control unit #1 (13') and outputs the memory address ADD_M_1 to the arbiter 61'.

On the other hand, when the memory address ADD_M_1 did not result in a hit, the evaluation signal generation circuit #1 outputs the memory address ADD_M_1 to the arbiter 61'. The case in which the memory address ADD_M_1 did not result in a hit is the case in which all the access evaluation circuits #1_1 to #1_p evaluate that the memory address ADD_M_1 included in the memory access information ACC_M_1 is not included in the memory areas stored to the protected area configuration registers #1_1 to #1_p.

The rewrite control circuit #1 calculates an address hit rate of each access evaluation circuits #1_1 to #1_p based on evaluation results output from the access evaluation circuit #1_1 to #1_p. Here, the address hit rate is a probability that the memory address ADD_M_1 included in the memory access information ACC_M_1 is included in the memory areas stored to the protected area configuration registers #1_1 to #1_p. The rewrite control circuit #1 rewrites, using register rewrite information SET_REG_1 supplied from the arbiter 61', the protected area information of the protected area configuration registers #1_1 to #1_p corresponding to the access evaluation circuit with the lowest address hit rate among the access evaluation circuits #1_1 to #1_p.

Note that the configuration of the local MPU #2 (72) included in the MPU control unit #2 (23') is the same as that of the local MPU #1 (71) included in the above-mentioned MPU control unit #1 (13'), thus the repeated explanation shall not be provided here. Additionally, in FIG. 7, both the number of the protected area configuration registers #1_1 to #1_p and the access evaluation circuits #1_1 to #1_p that are included in the local MPU #1 (71) and the number of protected area configuration registers #2_1 to #2_p and access evaluation circuits #2_1 to #2_p that are included in the local MPU #2 (72) shall be p. However, in this embodiment, the number of the protected area configuration registers #1_1 to #1_p and the access evaluation circuits #1_1 to #1_p that are included in the local MPU #1 (71) may be different from the number of the protected area configuration registers #2_1 to #2_p and the access evaluation circuits #2_1 to #2_p that are included in the local MPU #2 (72).

When the memory address ADD_M_n did not result in a hit in the local MPUs 71 and 72, the memory protection unit MPU #0 (60') evaluates whether or not the memory address ADD_M_n is included in the memory area stored to the protected area configuration registers #1 to #m that are included in the memory protection unit MPU #0 (60').

When there is conflict between the memory address ADD_M_1 output from the evaluation signal generation circuit #1 of the local MPU #1 (71) and the memory address ADD_M_2 output from the evaluation signal generation circuit #2 of the local MPU #2 (72), the arbiter 61' included in the memory protection unit MPU #0 (60') arbitrates the memory address ADD_M_1 and the memory address ADD_M_2. That is, the arbiter 61' outputs the memory address ADD_M_1 or the memory address ADD_M_2 to the area evaluation circuits #1 to #m.

The protected area configuration registers #1 to #m store the protected area information relating to the protected areas of the shared memory 32. That is, the protected area configuration registers #1 to #m store address information corresponding to memory areas of the shared memory 32 and authority information relating to authority of each core to access the memory areas of the shared memory 32. Note that the protected area configuration registers #1_1 to #1_m have the same configuration as the protected area configuration registers #1 to #m (see FIG. 4) explained in the second embodiment, thus the repeated explanation shall not be provided here.

The area evaluation circuits #1 to #m are provided to correspond to the protected area configuration registers #1 to #m, respectively. In other words, the protected area configuration registers #1 to #m and the area evaluation circuits #1 to #m are provided to correspond to the entries #1 to #m, respectively. The area evaluation circuits #1 to #m evaluate whether or not the memory address ADD_M_n is included in the memory areas stored to the protected area configuration registers #1 to #m based on the memory address ADD_M_n and the protected area information stored to the protected area configuration registers #1 to #m.

For example, when the memory address ADD_M_1 is included in the memory area #1 stored to the protected area configuration register #1, i.e., when the memory address ADD_M_1 is within the range between the upper limit address register (MPUA1) and the lower limit address register (MPLA1), the area evaluation circuit #1 evaluates that the memory address ADD_M_1 is included in the protected area of the entry #1.

The evaluation signal generation circuit #0 generates an evaluation signal HIT_n based on evaluation results output from the area evaluation circuits #1 to #m and outputs the generated evaluation signal HIT_n and the register rewrite information SET_REG_n to the arbiter 61'. Specifically, when any of the area evaluation circuits #1 to #m evaluates that the memory address ADD_M_n is included in the memory areas that are stored to the protected area configuration registers #1 to #m, the evaluation signal generation circuit #0 outputs, to the arbiter 61', the evaluation signal HIT_n indicating a hit of the memory address ADD_M_n. At this time, the evaluation signal generation circuit #0 outputs, to the arbiter 61', the protected area information corresponding to the memory address ADD_M_n that resulted in a hit (i.e., information stored to the protected area configuration registers #1 to #m) as the register rewrite information SET_REG_n.

For example, when the arbiter 61' selects the memory address ADD_M_1, the arbiter 61' outputs an evaluation signal HIT_1 to the local MPU #1 (71). Moreover, the arbiter 61' outputs the register rewrite information SET_REG_1 to the rewrite control circuit #1. When the register rewrite information SET_REG_1 is supplied, the rewrite control circuit #1 rewrites, using the register rewrite information SET_REG_1 supplied from the arbiter 61', the protected area information of the protected area configuration registers #1_1 to #1_p corresponding to the access evaluation circuit with the lowest address hit rate among the access evaluation circuits #1_1 to #1_p.

Figure 8:
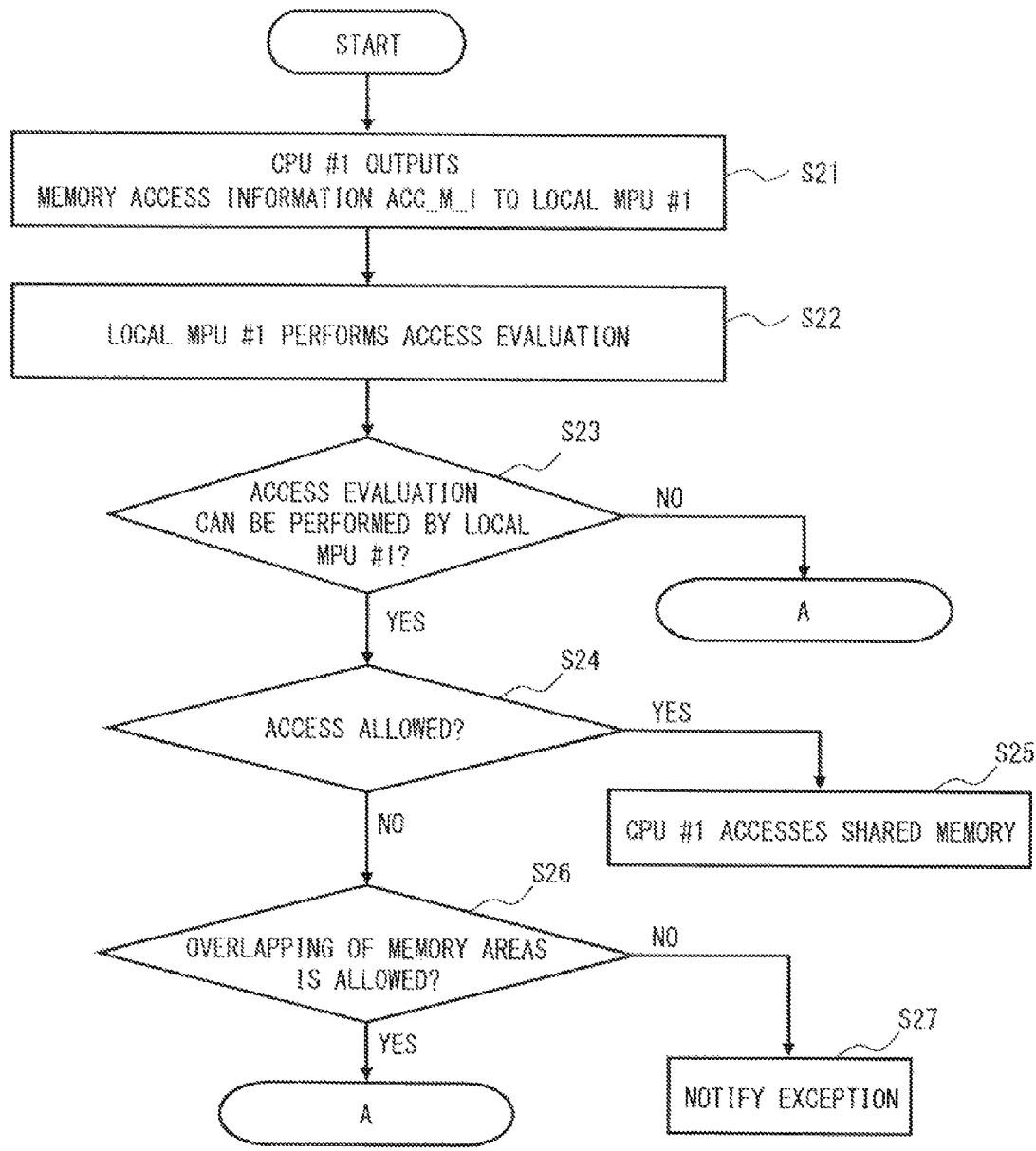
FIG. 8 is a flowchart for explaining an operation of the information processing apparatus according to the third embodiment.
Figure 9:
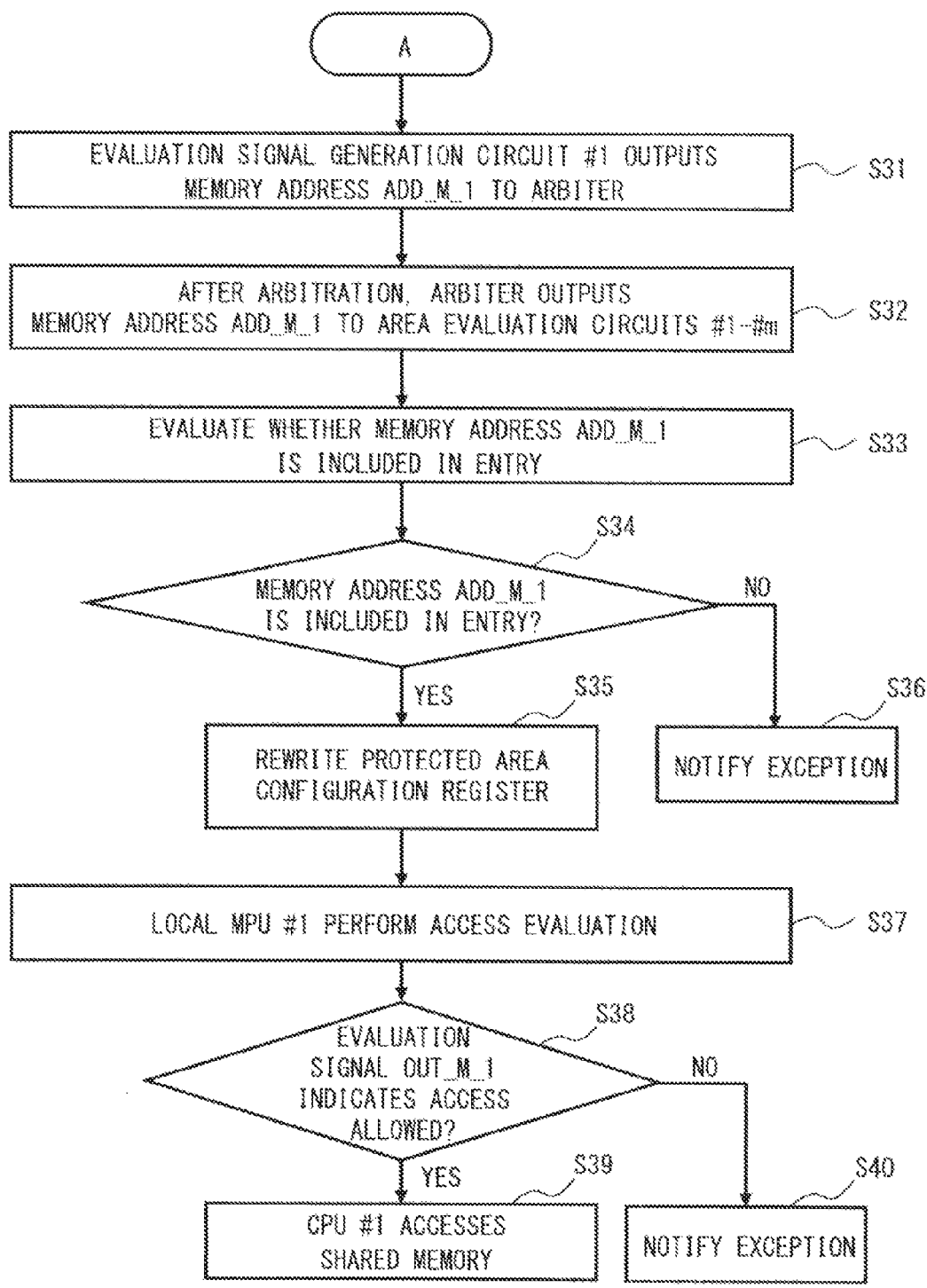
FIG. 9 is a flowchart for explaining an operation of the information processing apparatus according to the third embodiment.

Next, an operation of the information processing apparatus according to this embodiment is explained using flowcharts shown in FIGS. 8 and 9. Explained below is the case in which the CPU #1 included in the core #1 (10) accesses the shared memory 32 as an example.

When the CPU #1 accesses the shared memory 32, the CPU #1 outputs the memory access information ACC_M_1 to the local MPU #1 (71) (Step S21). That is, the memory access information ACC_M_1 output from the CPU #1 is temporarily held to the address register #1 and also supplied to the local MPU #1 (71). The local MPU #1 (71) performs access evaluation based on the memory access information ACC_M_1 (Step S22).

When any of the access evaluation circuits #1_1 to #1_p evaluates that the memory address included in the memory access information ACC_M_1 is included in the memory areas stored to the protected area configuration registers #1_1 to #1_p (i.e., when the memory address ADD_M_1 results in a hit), it is evaluated that access evaluation can be performed by the local MPU #1 (71) (Step S23: Yes). When the memory address ADD_M_1 results in a hit and the core #1 (10) is evaluated to have access authority to the memory area 32 (Step S24: Yes), the evaluation signal generation circuit #1 outputs the evaluation signal OUT_M_1 indicating access allowed to the MPU control unit #1 (13'). In this case, the MPU control unit #1 (13') outputs the access allowed notification signal to the CPU #1 as the notification signal ACK_1. After that, the CPU #1 accesses the shared memory 32 (Step S25).

On the other hand, when the memory address ADD_M_1 results in a hit but the core #1 (10) has no access authority to the memory area 32, the access is evaluated as prohibited (Step S24: No). When overlapping of the memory areas is allowed for each of the entries #1_1 to #1_p (Step S26: Yes), the process proceeds to the flowchart of FIG. 9. That is, when overlapping of the memory areas is allowed for each of the entries #1_1 to #1_p, it is necessary to perform access evaluation on other entries of the memory protection unit MPU #0 (60'). Meanwhile, when overlapping of the memory areas is not allowed for each of the entries #1_1 to #1_p (Step S26: No), the evaluation signal OUT_M_1 indicating access prohibited is output to the MPU control unit #1 (13'). Then, the MPU control unit #1 (13') outputs the exception notification signal to the CPU #1 as the notification signal ACK_1. In this case, access to the shared memory 32 by the CPU #1 is prohibited (Step S27).

Moreover, when the local MPU #1 (71) is unable to perform access evaluation (Step S23: No), i.e., when the memory address ADD_M_1 did not result in a hit, the evaluation signal generation circuit #1 outputs the memory address ADD_M_1 to the arbiter 61' (Step S31 of FIG. 9). The case in which the memory address ADD_M_1 did not result in a hit is the case in which all the access evaluation circuits #1_1 to #1_p evaluate that the memory address ADD_M_1 included in the memory access information ACC_M_1 is not included in the memory areas stored to the protected area configuration registers #1_1 to #1_p.

As shown in the flowchart of FIG. 9, when the evaluation signal generation circuit #1 outputs the memory address ADD_M_1 to the arbiter 61' (Step S31), after the arbiter 61' arbitrates the memory address ADD_M_1 and the memory address ADD_M_2, the arbiter 61' outputs the memory address ADD_M_1 to the area evaluation circuits #1 to #m. After that, the area evaluation circuits #1 to #m evaluate whether or not the memory address ADD_M_1 is included in the entries #1 to #m (Step S33). In other words, the area evaluation circuits #1 to #m evaluate whether or not the memory address ADD_M_1 is included in the memory areas stored to the protected area configuration registers #1 to #m (i.e., the area evaluation circuits #1 to #m evaluate whether or not the memory address ADD_M_1 results in a hit).

When all of the area evaluation circuits #1 to #m evaluate that the memory address ADD_M_1 is not included in the entries #1 to #m (Step S34: No), the evaluation signal generation circuit #0 outputs, to the MPU control unit #1 (13') via the arbiter 61', the evaluation signal HIT_1 that notifies a miss. When the evaluation signal HIT_1 that notifies a miss is supplied from the arbiter 61', the MPU control unit #1 (13') outputs the exception notification signal to the CPU #1 as the notification signal ACK_1 (Step S36). In this case, access to the shared memory 32 by the CPU #1 is prohibited.

Meanwhile, when the area evaluation circuits #1 to #m evaluate that the memory address ADD_M_1 is included in the entries #1 to #m (Step S34: Yes), the evaluation signal generation circuit #0 outputs, to the local MPU #1 (71) via the arbiter 61', the evaluation signal HIT_1 indicating a hit of the memory address ADD_M_1. At this time, the evaluation signal generation circuit #0 outputs, to the rewrite control circuit #1 via the arbiter 61', the protected area information corresponding to the memory address ADD_M_1 that resulted in a hit as the register rewrite information SET_REG_n. The rewrite control circuit #1 rewrites, using the register rewrite information SET_REG_1, the protected area information of the protected area configuration registers #1_1 to #1_p corresponding to the access evaluation circuit with the lowest address hit rate among the access evaluation circuits #1_1 to #1_p (Step S35).

After rewriting of the protected area configuration register, the local MPU #1 (71) performs access evaluation again based on the memory access information ACC_M_1 (Step S37). At this time, the memory access information ACC_M_1 is supplied from the address register #1. After the access evaluation, the evaluation signal generation circuit #1 outputs the evaluation signal OUT_M_1 to the MPU control unit #1 (13'). When the evaluation signal OUT_M_1 indicates that the access is allowed (Step S38: Yes), the MPU control unit #1 (13') outputs the access allowed notification signal to the CPU #1 as the notification signal ACK_1. After that, the CPU #1 accesses the shared memory 32 (Step S39). On the other hand, when the evaluation signal OUT_M_1 indicates that the access is prohibited (Step S38: No), the MPU control unit #1 (13') outputs the exception notification signal to the CPU #1 as the notification signal ACK_1 (Step S40). In this case, access to the shared memory 32 by the CPU #1 is prohibited.

As explained above, in the information processing apparatus according to this embodiment, the local MPU #1 (71) is provided in the core #1 (10), and the local MPU #2 (72) is provided in the core #2 (20). Further, prior to evaluation by the shared memory protection unit MPU #0 (60'), the local MPUs 71 and 72 each evaluate whether or not the corresponding core 10 and 20 is allowed to access the shared memory 32. At this time, the local MPUs 71 and 72 preferentially store the protected area information (information relating to the protected areas of the shared memory 32) corresponding to the entries with high address hit rates.

Therefore, prior to the evaluation by the shared memory protection unit MPU #0 (60'), the local MPUs 71 and 72 with a high address hit rate can perform access evaluation on the cores 10 and 20 to the shared memory 32, thereby increasing the processing speed of the information processing apparatus.

At this time, the number of the memory areas stored to the protected area configuration registers #1_1 to #1_p in the local MPU #1 (71) and the protected area configuration registers #2_1 to #2_p of the local MPU #2 (72) is less than the number of memory areas stored to the protected area configuration registers #1 to #m in the memory protection unit MPU #0 (60'). In other words, the number of entries m of the memory protection unit MPU #0 (60') is less than the number of entries p of the local MPUs 71 and 72 (p<m).

That is, access to the shared memory 32 by the cores 10 and 20 tends to become a timing critical path, thus the number of entries of the local MPUs 71 and 72 can be less than the number of entries of the memory protection unit MPU #0 (60'). Accordingly, the processing speed can be increased while reducing the power consumption of the information processing apparatus by previously performing access evaluation by the local MPUs 71 and 72 with a high address hit rate.

The memory protection unit is provided, for example, for preventing resources from being destroyed due to unexpected program behavior and for preventing a user program from performing unauthorized execution and data operation. A memory protection unit with less number of entries can be used for the memory areas that are usually accessed, thus while executing a normal program, there will be a small number of mistakes in access evaluation by the local MPUs 71 and 72.

Meanwhile, in access that could cause violation of memory protection, there can be a mistake in access evaluation by the local MPUs 71 and 72. In this case, although evaluation by the shared memory protection unit MPU #0 (60') is required, evaluation by the memory protection unit MPU #0 (60') takes only a short time, for example for one to two clocks, thus the influence is almost negligible.

Note that in normal access, when the address hit rate of the local MPUs 71 and 72 is 99.9% and when overhead in case there is a mistake in the local MPUs 71 and 72 is one clock, overhead of the number of clocks by the local MPUs 71 and 72 is (0.999×1+0.001×2)=1.001, which accounts for 0.1% of performance degradation.

Fourth Embodiment

Figure 10:
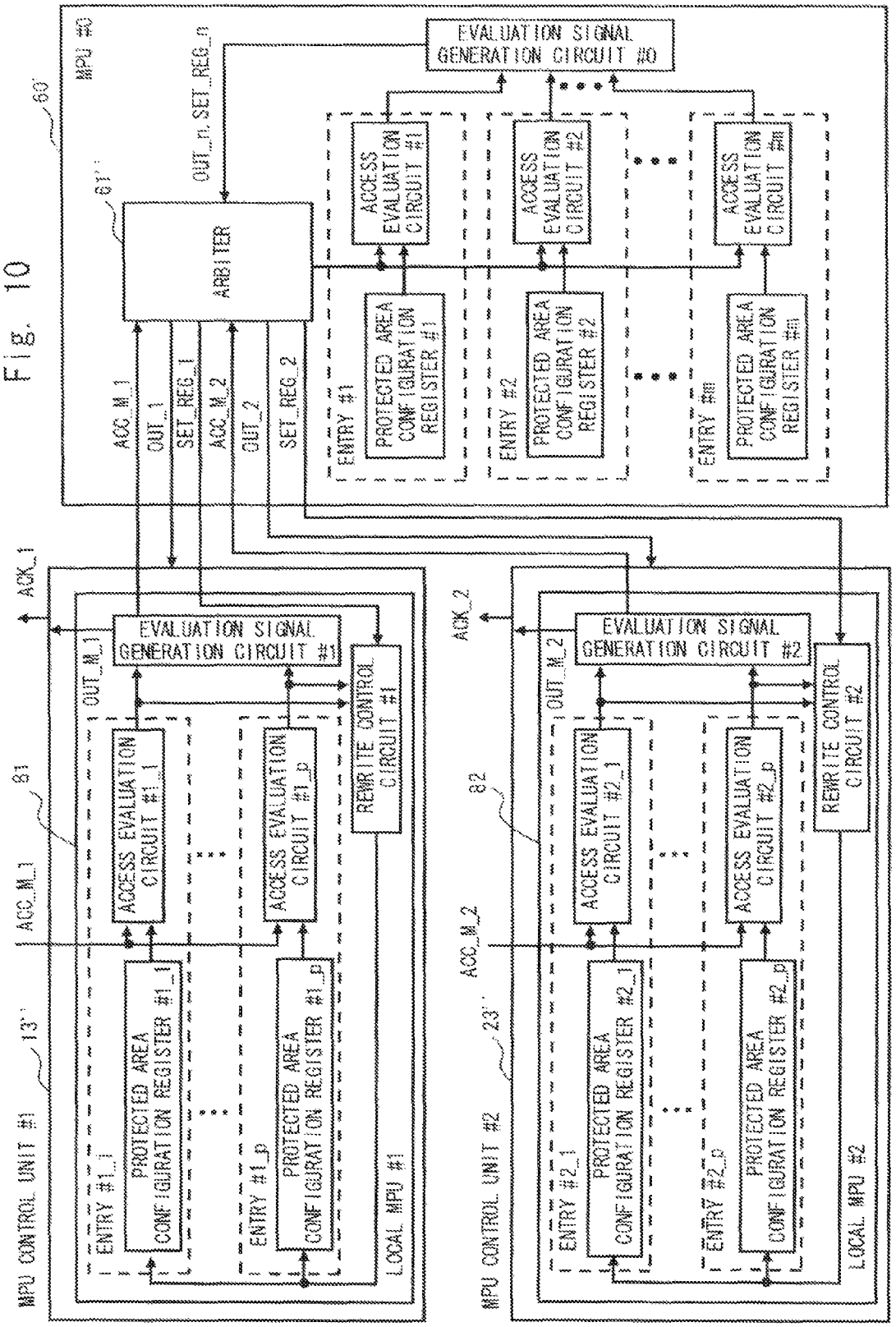
FIG. 10 is a block diagram showing MPU control units #1 and #2 and a memory protection unit MPU #0 that are included in the information processing apparatus according to a fourth embodiment.

Next, a fourth embodiment is explained. FIG. 10 is a block diagram showing an MPU control unit #1 (13"), an MPU control unit #2 (23"), and a memory protection unit MPU #0 (60") that are included in an information processing apparatus according to this embodiment. A difference of this embodiment from the information processing apparatus explained in the third embodiment is that when a memory address did not result in a hit in local MPUs 81 and 82, the memory protection unit MPU #0 (60") performs access evaluation. Other configuration is the same as the information processing apparatus explained in the third embodiment.

As shown in FIG. 10, the MPU control unit #1 (13") includes the local MPU #1 (81). The local MPU #1 (81) includes protected area configuration registers #1_1 to #1_p and access evaluation circuits #1_1 to #1_p, an evaluation signal generation circuit #1, and a rewrite control circuit #1. Here, p is an integer of 1≤p<m.

The protected area configuration registers #1_1 to #1_p store protected area information relating to protected areas of the shared memory 32. That is, the protected area configuration registers #1 to #m store address information corresponding to memory areas of the shared memory 32 and authority information relating to authority of the core #1 (10) to access the memory areas of the shared memory 32. Note that the protected area configuration registers #1_1 to #1_p have the same configuration as the protected area configuration registers #1 to #m (see FIG. 4) explained in the second embodiment, thus the repeated explanation shall not be provided here.

The access evaluation circuits #1_1 to #1_p are provided to correspond to the protected area configuration registers #1_1 to #1_p, respectively. In other words, the protected area configuration registers #1_1 to #1_p and the access evaluation circuit #1_1 to #1_p are provided to correspond to entries #1_1 to #1_p, respectively. The access evaluation circuits #1_1 to #1_p evaluate whether or not the core #1 (10) is allowed to access the shared memory 32 based on the memory access information ACC_M_1, which is output from the core #1 (10), and the protected area information, which is stored to the protected area configuration registers #1_1 to #1_p.

That is, when a memory address included in the memory access information ACC_M_1 is included in the memory areas stored to the protected area configuration registers #1_1 to #1_p, and further, when the core #1 (10) has access authority to the memory area 32, the access evaluation circuits #1_1 to #1_p evaluate that the core #1 (10) is allowed to access the shared memory 32.

The evaluation signal generation circuit #1 outputs an evaluation signal OUT_M_1 to the MPU control unit #1 (13") or the memory address ADD_M_1 to an arbiter 61".

That is, when the memory address ADD_M_1 results in a hit, and further, the core #1 (10) is evaluated to have access authority to the memory area 32, the evaluation signal generation circuit #1 generates the evaluation signal OUT_M_1 indicating access allowed and outputs the generated evaluation signal OUT_M_1 to the MPU control unit #1 (13"). The case in which the memory address ADD_M_1 results in a hit is the case in which any of the access evaluation circuits #1_1 to #1_p evaluates that the memory address ADD_M_1 included in the memory access information ACC_M_1 is included in the memory areas stored to the protected area configuration registers #1_1 to #1_p.

Meanwhile, when the memory address ADD_M_1 results in a hit, and further, the core #1 (10) is evaluated to have no access authority to the memory area 32, the evaluation signal generation circuit #1 generates the evaluation signal OUT_M_1 indicating access prohibited and outputs the generated evaluation signal OUT_M_1 to the MPU control unit #1 (13"). Note that when overlapping of the memory areas is allowed for the entries #1_1 to #1_p, it is necessary to perform access evaluation on other entries of the memory protection unit MPU #0 (60"). Thus, the evaluation signal generation circuit #1 will not output the evaluation signal OUT_M_1 to the MPU control unit #1 (13") and outputs the memory access information ACC_M_1 to the arbiter 61".

On the other hand, when the memory address ADD_M_1 did not result in a hit, the evaluation signal generation circuit #1 outputs the memory access information ACC_M_1 to the arbiter 61". The case in which the memory address ADD_M_1 did not result in a hit is the case in which all the access evaluation circuits #1_1 to #1_p evaluate that the memory address ADD_M_1 included in the memory access information ACC_M_1 is not included in the memory areas stored to the protected area configuration registers #1_1 to #1_p.

The rewrite control circuit #1 calculates an address hit rate of each access evaluation circuits #1_1 to #1_p based on evaluation results output from the access evaluation circuit #1_1 to #1_p. Here, the address hit rate is a probability that the memory address ADD_M_1 included in the memory access information ACC_M_1 is included in the memory areas stored to the protected area configuration registers #1_1 to #1_p. The rewrite control circuit #1 rewrites, using register rewrite information SET_REG_1 supplied from the arbiter 61", the protected area information of the protected area configuration registers #1_1 to #1_p corresponding to the access evaluation circuit with the lowest address hit rate among the access evaluation circuits #1_1 to #1_p.

Note that the configuration of the local MPU #2 (82) included in the MPU control unit #2 (23") is the same as that of the local MPU #1 (81) included in the above-mentioned MPU control unit #1 (13"), thus the repeated explanation shall not be provided here.

When the memory address ADD_M_n did not result in a hit in the local MPUs 81 and 82, the memory protection unit MPU #0 (60") performs access evaluation based on the memory access information ACC_M_n.

When there is conflict between the memory access information ACC_M_1 output from the evaluation signal generation circuit #1 of the local MPU #1 (81) and the memory access information ACC_M_2 output from the evaluation signal generation circuit #1 of the local MPU #2 (82), the arbiter 61" included in the memory protection unit MPU #0 (60") arbitrates the memory access information ACC_M_1 and the memory access information ACC_M_2. That is, the arbiter 61" outputs the memory access information ACC_M_1 or the memory access information ACC_M_2 to the access evaluation circuits#1 to #m.

The protected area configuration registers #1 to #m store protected area information relating to protected areas of the shared memory 32. That is, the protected area configuration registers #1 to #m store address information corresponding to memory areas of the shared memory 32 and authority information relating to authority of each core to access the memory areas of the shared memory 32. Note that the protected area configuration registers #1_1 to #1_p have the same configuration as the protected area configuration registers #1 to #m (see FIG. 4) explained in the second embodiment, thus the repeated explanation shall not be provided here.

The area evaluation circuits #1 to #m are provided to correspond to the protected area configuration registers #1 to #m, respectively. In other words, the protected area configuration registers #1 to #m and the area evaluation circuits #1 to #m are provided to correspond to the entries #1 to #m, respectively. The access evaluation circuits #1 to #m evaluate whether or not the core #1 (10) and the core #2 (20) are allowed to access the shared memory 32 based on the memory access information ACC_M_n and the protected area information that is stored to the protected area configuration registers #1 to #m.

That is, when a memory address included in the memory access information ACC_M_n is included in the memory areas stored to the protected area configuration registers #1 to #m, and further, when the core #1 (10) and the core #2 (20) have access authority to the memory area 32, the access evaluation circuits #1 to #m evaluate that the core #1 (10) and the core #2 (20) are allowed to access the shared memory 32.

For example, when a memory address included in the memory access information ACC_M_1 is included in the memory area #1 stored to the protected area configuration register #1, i.e., when the memory address is within the range between the upper limit address register (MPUA1) and the lower limit address register (MPLA1), the area evaluation circuit #1 evaluates that the memory address ADD_M_1 is included in the entry #1. Further, when a type of access to the shared memory 32 (i.e., write, read, execute etc.) by the core #1 (10) is allowed, the access evaluation circuit #1 allows the core #1 (10) to access the shared memory 32. Here, the case in which a type of access is allowed is the case in which a type of access to the shared memory 32 by the core #1 (10) is allowed in the attribute register (MPAT1).

The evaluation signal generation circuit #0 generates an evaluation signal OUT_n based on an evaluation result output from the access evaluation circuits #1 to #m and outputs the generated evaluation signal OUT_n to the arbiter 61". That is, when any of the access evaluation circuits #1 to #m evaluates that access to the shared memory 32 is allowed, the evaluation signal generation circuit #0 generates the evaluation signal OUT_n indicating access allowed to the shared memory 32 and outputs the generated evaluation signal OUT_n to the arbiter 61". On the other hand, when all of the access evaluation circuits #1 to #m evaluate that access to the shared memory 32 is prohibited, the evaluation signal generation circuit #0 generates the evaluation signal OUT_n indicating access prohibited to the shared memory 32 and outputs the generated evaluation signal OUT_n to the arbiter 61".

At this time, the evaluation signal generation circuit #0 outputs, to the arbiter 61", the protected area information corresponding to the memory address ADD_M_n that resulted in a hit (i.e., information stored to the protected area configuration registers #1 to #m) as the register rewrite information SET_REG_n. Note that when the memory areas of the entries #1 to #m are configured to overlap with each other, a plurality of the access evaluation circuits #1 to #m may evaluate that access is allowed.

For example, when the arbiter 61" selects the memory address ADD_M_1, the arbiter 61" outputs the evaluation signal OUT_1 to the local MPU #1 (71). Moreover, the arbiter 61" outputs the register rewrite information SET_REG_1 to the rewrite control circuit #1. When the register rewrite information SET_REG_1 is supplied, the rewrite control circuit #1 rewrites, using the register rewrite information SET_REG_1 supplied from the arbiter 61", the protected area information of the protected area configuration registers #1_1 to #1_p corresponding to the access evaluation circuit with the lowest address hit rate among the access evaluation circuits #1_1 to #1_p.

Figure 11:
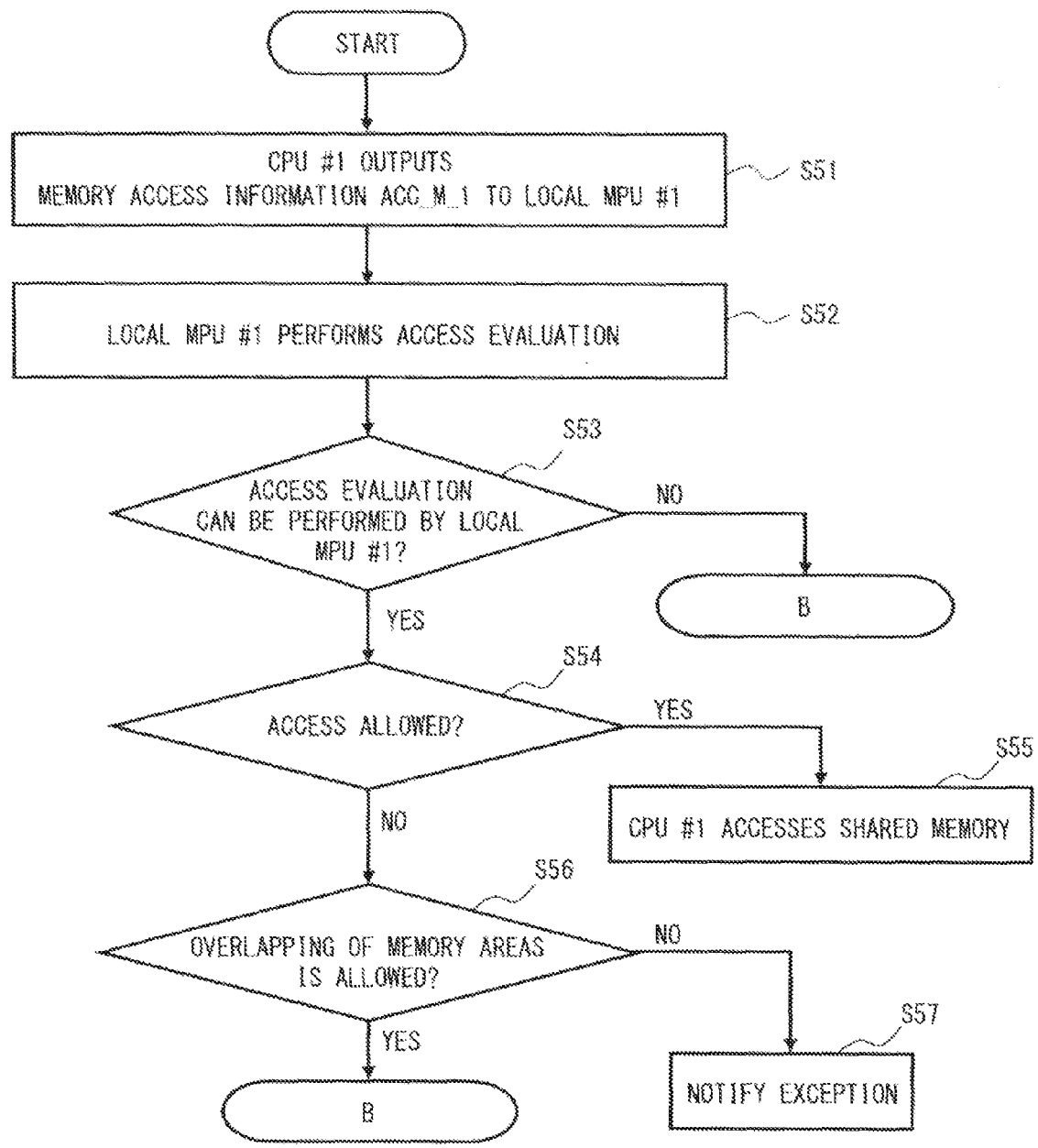
FIG. 11 is a flowchart for explaining an operation of the information processing apparatus according to the fourth embodiment.
Figure 12:
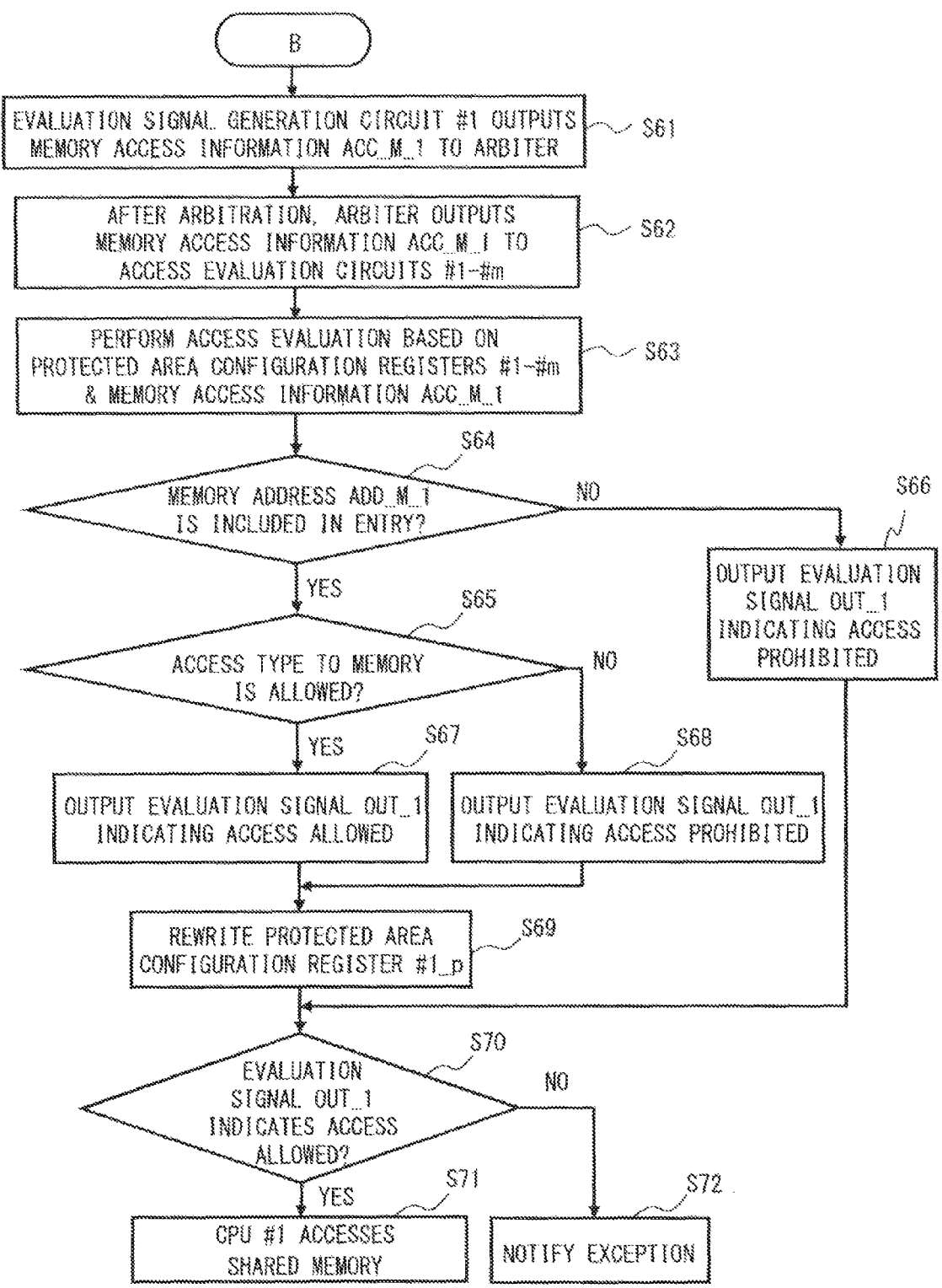
FIG. 12 is a flowchart for explaining an operation of the information processing apparatus according to the fourth embodiment.

Next, an operation of the information processing apparatus according to this embodiment is explained using flowcharts shown in FIGS. 11 and 12. Explained below is the case in which the CPU #1 included in the core #1 (10) accesses the shared memory 32 as an example.

When the CPU #1 accesses the shared memory 32, the CPU #1 outputs the memory access information ACC_M_1 to the local MPU #1 (81) (Step S51). The local MPU #1 (81) performs access evaluation based on the memory access information ACC_M_1 (Step S52).

When any of the access evaluation circuits #1_1 to #1_p evaluates that the memory address included in the memory access information ACC_M_1 is included in the memory areas stored to the protected area configuration registers #1_1 to #1_p (i.e., when the memory address ADD_M_1 results in a hit), it is evaluated that access evaluation can be performed by the local MPU #1 (81) (Step S53: Yes). When the memory address ADD_M_1 results in a hit and the core #1 (10) is evaluated to have access authority to the memory area 32 (Step S54: Yes), the evaluation signal generation circuit #1 outputs the evaluation signal OUT_M_1 indicating access allowed to the MPU control unit #1 (13"). In this case, the MPU control unit #1 (13") outputs the access allowed notification signal to the CPU #1 as the notification signal ACK_1. After that, the CPU #1 accesses the shared memory 32 (Step S55).

On the other hand, when the memory address ADD_M_1 results in a hit but the core #1 (10) has no access authority to the memory area 32, the access is evaluated as prohibited (Step S54: No). When overlapping of the memory areas is allowed for each of the entries #1_1 to #1_p (Step S56: Yes), the process proceeds to the flowchart of FIG. 12. That is, when overlapping of the memory areas is allowed for each of the entries #1_1 to #1_p, it is necessary to perform access evaluation on other entries of the memory protection unit MPU #0 (60"). Meanwhile, when overlapping of the memory areas is not allowed for each of the entries #1_1 to #1_p (Step S56: No), the evaluation signal OUT_M_1 indicating access prohibited is output to the MPU control unit #1 (13"). Then, the MPU control unit #1 (13") outputs the exception notification signal to the CPU #1 as the notification signal ACK_1. In this case, access to the shared memory 32 by the CPU #1 is prohibited (Step S57).

Moreover, when the local MPU #1 (81) is unable to perform access evaluation (Step S53: No), i.e., when the memory address ADD_M_1 did not result in a hit, the evaluation signal generation circuit #1 outputs the memory access information ACC_M_1 to the arbiter 61" (Step S61 of FIG. 12). The case in which the memory address ADD_M_1 did not result in a hit is the case in which all the access evaluation circuits #1_1 to #1_p evaluate that the memory address ADD_M_1 included in the memory access information ACC_M_1 is not included in the memory areas stored to the protected area configuration registers #1_1 to #1_p.

As shown in the flowchart of FIG. 12, when the evaluation signal generation circuit #1 outputs the memory access information ACC_M_1 to the arbiter 61" (Step S61), after the arbiter 61" arbitrates the memory access information ACC_M_1 and the memory access information ACC_M_2, the arbiter 61" outputs the memory access information ACC_M_1 to the area evaluation circuits #1 to #m (Step S62).

After that, the access evaluation circuits #1 to #m perform access evaluation based on the protected area configuration registers #1 to #m and the memory access information ACC_M_1 (Step S63). That is, the access evaluation circuits #1 to #m evaluate whether or not the memory address ADD_M_1 included in the memory access information ACC_M_1 is included in the respective entries #1 to #m (i.e., the memory areas #1 to #m that are stored to the protected area configuration registers #1 to #m). Then, when the memory address ADD_M_1 is not included in the entries #1 to #m (Step S64: No), the access evaluation circuits #1 to #m output evaluation results indicating that access is prohibited. At this time, the evaluation signal generation circuit #0 generates the evaluation signal OUT_1 indicating access prohibited and outputs the evaluation signal OUT_1 to the arbiter 61" (Step S66).

Meanwhile, when the memory address ADD_M_1 is included in the entries #1 to #m (Step S64: Yes), and further, when a type of access (e.g., read, write, execute) to the shared memory 32 by the CPU #1 is allowed (Step S65: Yes), the access evaluation circuits #1 to #m output evaluation results indicating that the access is allowed. At this time, the evaluation signal generation circuit #0 generates the evaluation signal OUT_1 indicating access allowed and outputs the generated evaluation signal OUT_1 to the arbiter 61" (Step S67). Here, the case in which a type of access to the shared memory 32 by the CPU #1 is allowed is the case in which a type of access to the shared memory 32 by the CPU #1 is allowed in the attribute registers of the protected area configuration registers #1 to #m, for example. Still further, the evaluation signal generation circuit #0 outputs, to the rewrite control circuit #1 via the arbiter 61", the protected area information corresponding to the memory address ADD_M_1 that resulted in a hit as the register rewrite information SET_REG_1.

Alternatively, when the memory address ADD_M_1 is included in the entries #1 to #m (Step S64: Yes), and further, when a type of access to the shared memory 32 by the CPU #1 is not allowed (Step S65: No), the access evaluation circuits #1 to #m output evaluation results indicating that the access is prohibited. At this time, the evaluation signal generation circuit #0 generates the evaluation signal OUT_1 indicating access prohibited and outputs the generated evaluation signal OUT_1 to the arbiter 61" (Step S68). Furthermore, the evaluation signal generation circuit #0 outputs, to the rewrite control circuit #1 via arbiter 61", protected area information corresponding to the memory address ADD_M_1 that resulted in a hit as the register rewrite information SET_REG_1.

In response to the register rewrite information SET_REG_1 (Steps S67 and S68), the rewrite control circuit #1 rewrites, using the register rewrite information SET_REG_1, the protected area information of the protected area configuration registers #1_1 to #1_p corresponding to the access evaluation circuit with the lowest address hit rate among the access evaluation circuits #1_1 to #1_p.

Moreover, the arbiter 61" outputs the evaluation signal OUT_1 to the MPU control unit #1 (13"). Then, when the evaluation signal OUT_1 indicates that the access is allowed (Step S70: Yes), the MPU control unit #1 (13") outputs the access allowed notification signal to the CPU #1 as the notification signal ACK_1. After that, the CPU #1 accesses the shared memory 32 (Step S71). On the other hand, when the evaluation signal OUT_1 indicates that the access is prohibited (Step S70: No), the MPU control unit #1 (13") outputs the exception notification signal to the CPU #1 as the notification signal ACK_1 (Step S72). In this case, access to the shared memory 32 by CPU #1 is prohibited.

As explained above, in a similar manner to the information processing apparatus explained in the third embodiment, the information processing apparatus according to this embodiment can increase the processing speed while reducing power consumption of the information processing apparatus.

Note that although the information processing apparatus including two cores is explained so far, the information processing apparatus explained in each of the embodiments may include three or more cores.

Moreover, the first embodiment explained an example in which the information processing apparatus includes the shared register #0 (50) and the memory protection unit MPU #0 (60) as the shared resource #0 (30) as an example. However, the information processing apparatus according to the first embodiment may be configured to include only the shared register #0 (50) (i.e., the memory protection unit MPU #0 (60) may not be included). Meanwhile, the information processing apparatus according to the second to fourth embodiments may include at least the memory protection unit MPU #0 (60) as the shared resource #0 (30) and it is not necessary to include the shared register #0 (50).

The first to fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An information processing method using an information processing apparatus, wherein
the information processing apparatus comprises:
a plurality of cores;
a shared resource that can be shared by the plurality of cores; and
a local register that stores configuration information peculiar to each of the plurality of cores,
the shared resource is provided independently of the plurality of cores,
the local register is provided in each of the plurality of cores,
the shared resource comprises a memory protection circuit that protects a shared memory from invalid access by each of the plurality of cores,
each of the plurality of cores comprises a local memory protection circuit that evaluates whether or not the corresponding core can access the shared memory prior to evaluation by the memory protection circuit,
each of the local memory protection circuit comprises:
a second protected area configuration register storing protected area information relating to a protected area of the shared memory;
a second access evaluation circuit provided to correspond to the second protected area configuration register; and
a rewrite control circuit that rewrites the protected area information stored in the second protected area configuration register,
the memory protection circuit comprises:
a first protected area configuration register storing the protected area information relating to the protected area of the shared memory; and
a first access evaluation circuit that evaluates whether or not the core is allowed to access the shared memory, and
the information processing method comprises:
referring, in each of the local memory protection circuits, by the second access evaluation circuit, to the second protected area configuration register and evaluating whether or not each of the plurality of cores is allowed to access the shared memory based on the memory access information and the protected area information;
evaluating, in the memory protection circuit, when the memory address included in the memory access information is not included in the memory area stored in the second protected area configuration register, by the first access evaluation circuit, whether or not the core is allowed to access the shared memory; and
rewriting, by a rewrite control circuit, protected area information stored in the second protected area configuration register by using protected area information relating to a protected area of the shared memory stored in the first protected area configuration register included in the memory protection circuit.

2. The information processing method according to claim 1, wherein the number of memory areas stored in the second protected area configuration register is less than the number of memory areas stored in the first protected area configuration register.

3. The information processing method according to claim 1, wherein an address hit rate of each of the second access evaluation circuit is calculated based on an evaluation result output from the second access evaluation circuit and protected area information stored in the second protected area configuration register corresponding to the access evaluation circuit with the lowest address hit rate is rewritten by using protected area information stored in the first protected area configuration register.

4. The information processing method according to claim 1, wherein
the first protected area configuration register stores address information corresponding to a memory area of the shared memory and authority information relating to authority of each of the plurality of cores to access the memory area, and
when a memory address included in the memory access information is included in the memory area stored in the first protected area configuration register, and further, when the core has access authority to the memory area, it is evaluated that the core can access the shared memory.

5. The information processing method according to claim 1, wherein
the first protected area configuration register stores address information corresponding to a memory area of the shared memory and authority information relating to authority of each of the plurality of cores to access the memory area, and when a memory address included in the memory access information is not included in the memory area stored in the first protected area configuration register, and further, when the core has access authority to the memory area, the memory protection circuit evaluates that the core cannot access the shared memory.

6. An information processing method using an information processing apparatus, wherein the information processing apparatus comprises:
  a plurality of cores;
  a shared resource that can be shared by the plurality of cores; and
  a local register that stores configuration information peculiar to each of the plurality of cores,
the shared resource is provided independently of the plurality of cores,
the local register is provided in each of the plurality of cores,
the shared resource comprises a memory protection circuit that protects a shared memory from invalid access by each of the plurality of cores,
each of the plurality of cores comprises a local memory protection circuit that evaluates whether or not the corresponding core can access the shared memory prior to evaluation by the memory protection circuit,
each of the local memory protection circuit comprises:
  a second protected area configuration register storing protected area information relating to a protected area of the shared memory;
  a second access evaluation circuit provided to correspond to the second protected area configuration register; and
  a rewrite control circuit that rewrites the protected area information stored in the second protected area configuration register,
the memory protection circuit comprises:
  a first protected area configuration register storing the protected area information relating to the protected area of the shared memory; and
  an area evaluation circuit that evaluates whether or not the memory address included in the memory access information is included in the memory area stored to the first protected area configuration register, and
the information processing method comprises:
  referring, in each of the local memory protection circuits, by the second access evaluation circuit, to the second protected area configuration register and evaluating whether or not each of the plurality of cores is allowed to access the shared memory based on the memory access information and the protected area information;
  evaluating, in the memory protection circuit, when the memory address included in the memory access information is not included in the memory area stored in the second protected area configuration register, by the area evaluation circuit, whether or not the memory address is included in the memory area stored in the first protected area configuration register storing protected area information relating to a protected area of the shared memory;
  rewriting, in the local memory protection circuit, when it is determined that the memory address is included in a memory area stored in the first protected area configuration register by the area evaluation circuit, by the rewrite control circuit, protected area information stored in the second protected area configuration register by using protected area information stored in the first protected area configuration register; and
  evaluating again, after the second protected area configuration register is rewritten, by the second access evaluation circuit, whether or not the core is allowed to access the shared memory based on the memory access information and rewritten protected area information stored in the second protected area configuration register.

7. The information processing method according to claim 6, wherein the number of memory areas stored in the second protected area configuration register is less than the number of memory areas stored in the first protected area configuration register.

8. The information processing method according to claim 6, wherein an address hit rate of each of the second access evaluation circuit is calculated based on an evaluation result output from the second access evaluation circuit and protected area information stored in the second protected area configuration register corresponding to the access evaluation circuit with the lowest address hit rate is rewritten by using protected area information stored in the first protected area configuration register.

9. The information processing method according to claim 6, wherein
  the first protected area configuration register stores address information corresponding to a memory area of the shared memory and authority information relating to authority of each of the plurality of cores to access the memory area, and
  when a memory address included in the memory access information is included in the memory area stored in the first protected area configuration register, and further, when the core has access authority to the memory area, the memory protection circuit evaluates that the core can access the shared memory.

10. The information processing method according to claim 6, wherein
  the first protected area configuration register stores address information corresponding to a memory area of the shared memory and authority information relating to authority of each of the plurality of cores to access the memory area, and
  when a memory address included in the memory access information is not included in the memory area stored in the first protected area configuration register, and further, when the core has access authority to the memory area, the memory protection circuit evaluates that the core cannot access the shared memory.

* * * * *